US010855266B2

(12) United States Patent
Tajima

(10) Patent No.: US 10,855,266 B2
(45) Date of Patent: Dec. 1, 2020

(54) SEMICONDUCTOR DEVICE, LOAD DRIVE SYSTEM AND METHOD OF DETECTING INDUCTOR CURRENT

(71) Applicant: RENESAS ELECTRONICS CORPORATION, Tokyo (JP)

(72) Inventor: Hideyuki Tajima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/223,969

(22) Filed: Dec. 18, 2018

(65) Prior Publication Data

US 2019/0229717 A1 Jul. 25, 2019

(30) Foreign Application Priority Data

Jan. 25, 2018 (JP) .................................. 2018-010234

(51) Int. Cl.
| | |
|---|---|
| H03K 7/08 | (2006.01) |
| G11C 27/02 | (2006.01) |
| H03K 5/14 | (2014.01) |
| H03K 17/687 | (2006.01) |
| F16H 61/02 | (2006.01) |
| G01R 19/25 | (2006.01) |
| H03K 17/18 | (2006.01) |
| H03K 5/00 | (2006.01) |

(52) U.S. Cl.
CPC ............ *H03K 7/08* (2013.01); *F16H 61/0202* (2013.01); *G01R 19/2509* (2013.01); *G11C 27/02* (2013.01); *G11C 27/024* (2013.01); *H03K 5/14* (2013.01); *H03K 17/18* (2013.01); *H03K 17/6871* (2013.01); *H03K 2005/00013* (2013.01); *H03K 2217/0027* (2013.01); *H03K 2217/0063* (2013.01); *H03K 2217/0072* (2013.01)

(58) Field of Classification Search
CPC ...... H03K 7/08; H03K 17/18; H03K 17/6871; G01R 19/2509; G11C 27/02; G11C 27/024
USPC ....................... 327/108–112; 326/82, 83, 87; 323/282–290
See application file for complete search history.

(56) References Cited

U.S. PATENT DOCUMENTS

| | | |
|---|---|---|
| 8,421,441 B2 | 4/2013 | Hirotsu et al. |
| 9,571,075 B1* | 2/2017 | Ng ........................... H03K 5/08 |
| 2010/0253296 A1* | 10/2010 | Huang ................ H02M 3/1588 |
| | | 323/225 |

FOREIGN PATENT DOCUMENTS

JP   2011-097434 A   5/2011

* cited by examiner

*Primary Examiner* — Tomi Skibinski
(74) *Attorney, Agent, or Firm* — McDermott Will & Emery LLP

(57) ABSTRACT

A monitor circuit monitors a gate potential applied to a gate of a high-side transistor or monitors an output potential generated at an output terminal and generates either one or both of a high-side sampling timing and a high-side holding timing based on the monitored result. A current detection circuit detects an inductor current flowing in an inductor and generates a first detection voltage proportional to the inductor current. A sample-and-hold circuit starts a sampling operation of the first detection voltage in response to the high-side sampling timing and starts a holding operation of the first detection voltage in response to the high-side holding timing so as to output a second detection voltage.

20 Claims, 21 Drawing Sheets

SEMICONDUCTOR DEVICE, LOAD DRIVE SYSTEM AND METHOD OF DETECTING INDUCTOR CURRENT

CROSS-REFERENCE TO RELATED APPLICATION

The present application claims priority from Japanese Patent Application No. 2018-010234 filed on Jan. 25, 2018, the content of which is hereby incorporated by reference into this application.

TECHNICAL FIELD OF THE INVENTION

The present invention relates to a semiconductor device, a load drive system and a method of detecting an inductor current, and relates to a technique in which, for example, the inductor current flowing in the inductor serving as a load is controlled by PWM (Pulse Width Modulation).

BACKGROUND OF THE INVENTION

Japanese Patent Application Laid-Open Publication No. 2011-97434 (Patent Document 1) discloses a current-controlled semiconductor device comprising a high-side MOSFET that is connected to a solenoid and is controlled by PWM, a current-voltage conversion circuit that detects a current flowing in the high-side MOSFET and converts the current into a voltage, and an AD converter that digitally converts the converted voltage.

SUMMARY OF THE INVENTION

Generally, in the field of power electronics, a system in which a switching element is controlled by PWM to perform feedback control of an inductor current flowing in an inductor is widely used. In such a system, it is necessary to detect the inductor current with using a method as disclosed in the Patent Document 1 and the like. At this time, in order to make the system perform controls with high accuracy, it is preferable that the inductor current is detected with high accuracy. However, as disclosed in, for example, the Patent Document 1, this configuration in which an output of a current-voltage conversion circuit is directly digitally converted would often cause a relatively large error in a detection value of the inductor current.

The embodiments described below are provided in view of this situation, and other problems and novel features will be apparent from the description in the present specification with reference to the attached drawings.

A semiconductor device according to one embodiment of the present invention includes a high-side transistor, a PWM signal-generating circuit, a monitor circuit, a current detection circuit, and a sample-and-hold circuit. The high-side transistor is coupled between a high-potential side power-supply potential and an output terminal and allows power to be accumulated in an inductor via the output terminal when the high-side transistor is controlled to be ON. The PWM signal-generating circuit generates a PWM signal that controls ON/OFF of the high-side transistor. The monitor circuit monitors a high-side control input potential applied to a control input node of the high-side transistor or monitors an output potential generated at the output terminal and generates either one or both of a high-side sampling timing and a high-side holding timing based on the monitored result. The current detection circuit detects an inductor current flowing in the inductor and generates a first detection voltage proportional to the detected current. The sample-and-hold circuit starts a sampling operation of the first detection voltage in response to the high-side sampling timing and starts a holding operation of the first detection voltage in response to the high-side holding timing so as to output a second detection voltage.

According to the above-described embodiment, an inductor current can be detected with high accuracy.

BRIEF DESCRIPTIONS OF THE DRAWINGS

DESCRIPTIONS OF THE PREFERRED EMBODIMENTS

In the embodiments described below, the invention will be described in a plurality of sections or embodiments if necessary for the sake of convenience. However, these sections or embodiments are not irrelevant to each other unless otherwise clearly specified, and one section or embodiment partially or entirely corresponds to another section or embodiment as a modification, detailed or supplementary description or the like. In addition, in the embodiments described below, when referring to the number of a component (including number of pieces, numerical value, amount and range), the number is not limited to a specified number and may be less than or greater than this number unless otherwise clearly specified or unless it is obvious from the context that the number is limited to the specified number in principle.

Furthermore, in the embodiments described below, it goes without saying that each component (including an element step) is not indispensable unless otherwise clearly specified or unless it is obvious from the context that the component is indispensable in principle. Likewise, in the embodiments described below, when referring to a shape, a positional relation or the like of a component, a substantially approximate shape, a similar shape or the like is included unless otherwise clearly specified or unless it is obvious from the context that the shape, the positional relation or the like of the component differs in principle. The same applies to the above-described numerical value and range.

Hereinafter, embodiments of the present invention will be described in detail with reference to the drawings. Note that, in all of the drawings used to describe the embodiments, the same members are generally denoted by the same reference signs, and redundant descriptions thereof are omitted as appropriate.

(First Embodiment)

«Overview and Problems of Load Drive System (Comparative Example)»

Figure 19:
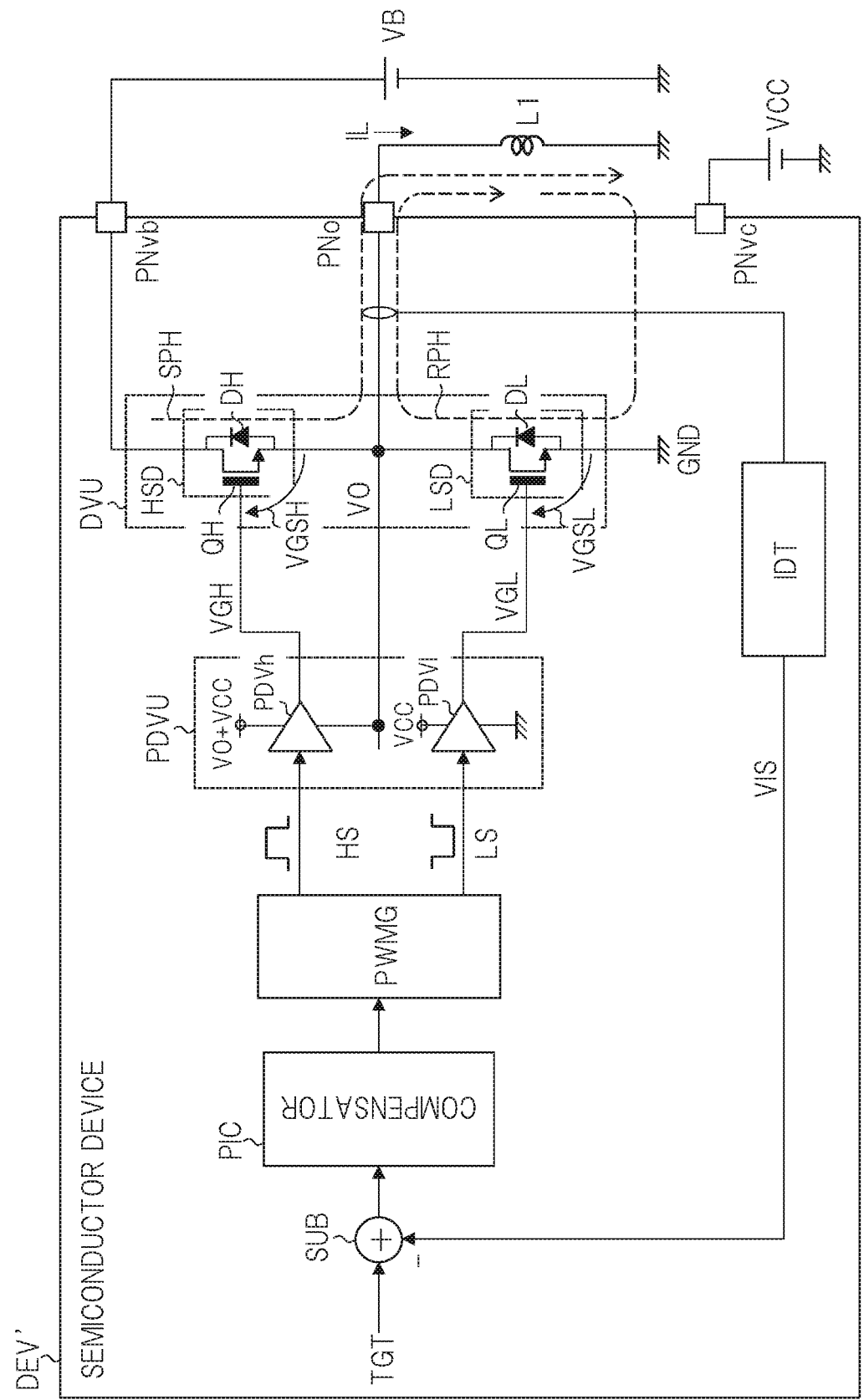
FIG. 19 is a schematic diagram showing a configuration example of a main part of a load drive system given as a comparative example with respect to the present invention.
Figure 20A:
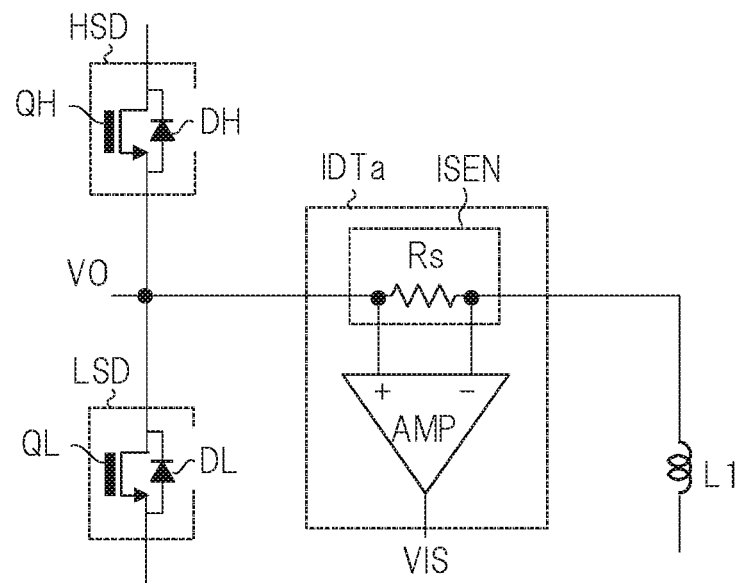
FIGS. 20A and 20B are schematic diagrams showing configuration examples of a current detection circuit of FIG. 19.
Figure 20B:
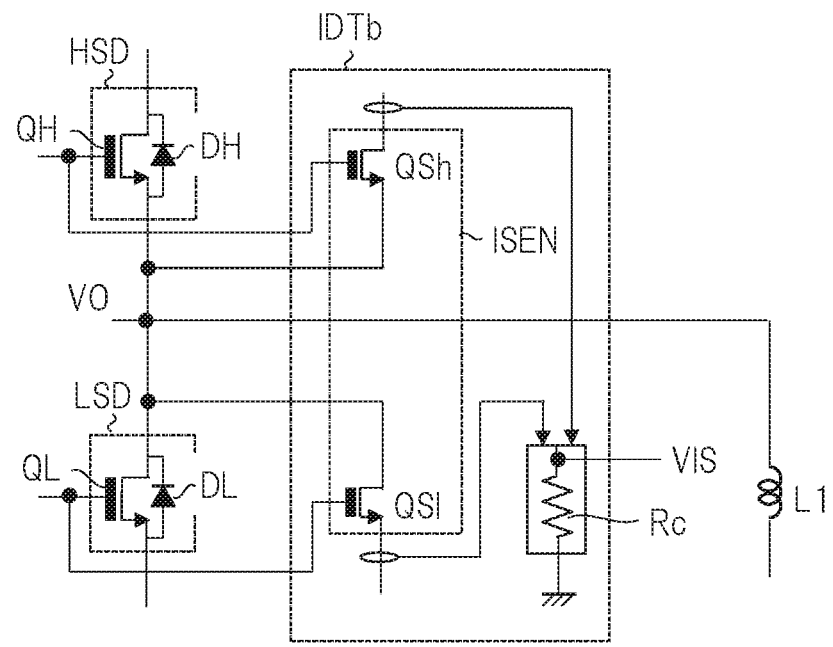

FIG. 19 is a schematic diagram showing a configuration example of a main part of a load drive system given as a comparative example with respect to the present invention. FIGS. 20A and 20B are schematic diagrams showing configuration examples of a current detection circuit of FIG. 19. The load drive system shown in FIG. 19 comprises, for example, a semiconductor device DEV' constituted by a single semiconductor chip, an inductor L1 that is driven by the semiconductor device DEV' and serves as a load, a battery power-supply that generates a battery power-supply potential VB, and a chip power-supply that generates a chip power-supply potential VCC. The battery power-supply potential VB ranges from, for example, 5 V to 45 V, and is typically approximately 13 V or the like. The chip power-supply potential VCC is, for example, a few volts, and is typically 3.3 V or the like.

The semiconductor device DEV' comprises power-supply terminals PNvb and PNvc and an output terminal PNo serving as external terminals, a driver unit DVU, a pre-driver unit PDVU, a PWM signal-generating circuit PWMG, a compensator PIC, a current detection circuit IDT, and an error detector SUB. The battery power-supply potential VB is supplied to the power-supply terminal PNvb, and the chip power-supply potential VCC is supplied to the power-supply terminal PNvc. The inductor L1 is coupled to the output terminal PNo and serves as the load.

The driver unit DVU comprises a high-side driver HSD that includes a high-side transistor QH and a freewheeling diode DH, and a low-side driver LSD that includes a low-side transistor QL and a freewheeling diode DL. In this example, the high-side transistor QH and the low-side transistor QL are n-channel type MOSFETs. The high-side transistor QH and the freewheeling diode DH are coupled in parallel between the battery power-supply potential VB and the output terminal PNo. The low-side transistor QL and the freewheeling diode DL are coupled in parallel between the output terminal PNo and a ground power-supply potential GND.

The high-side transistor QH is controlled by a PWM signal and allows power to accumulate in the inductor L1 via the output terminal PNo when the high-side transistor QH is controlled to be ON. FIG. 19 shows a current path SPH of an inductor current IL flowed in the inductor L1 at this time. On the other hand, the low-side driver LSD has its ON/OFF controlled complementarily with the high-side transistor QH and allows the inductor current IL to reflow when the low-side driver LSD is controlled to be ON. FIG. 19 shows a current path RPH of the inductor current IL at this time. In the present specification, the inductor current IL flowed in the current path SPH is referred to as a "drive current" and the inductor current IL flowed in the current path RPH is referred to as a "return current". The low-side transistor QL performs synchronous rectification when the low-side transistor QL is controlled to be ON and allows the return current to flow in place of the freewheeling diode DL.

The current detection circuit IDT detects the inductor current IL by various configurations typified by the configurations shown in FIGS. 20A and 20B and generates a detection voltage VIS proportional to the inductor current IL. A current detection circuit IDTa shown in FIG. 20A is a shunt resistor circuit and comprises an amplifier circuit AMP and a sense resistive element Rs serving as a current sensor ISEN. The sense resistive element Rs is coupled in series with the inductor L1, and the amplifier circuit AMP detects the voltage at both ends of the sense resistive element Rs so as to output the detection voltage VIS.

A current detection circuit IDTb shown in FIG. 20B is a sense transistor circuit and comprises a voltage conversion resistive element Rc and sense transistors QSh and QSl serving as the current sensor ISEN. The sense transistor QSh has its ON/OFF controlled by an ON/OFF control voltage (gate-source voltage VGSH) of the high-side transistor QH and allows a current proportional to the current flowing in the high-side transistor QH (a current according to a transistor size ratio) to flow therein. Likewise, the sense transistor QSl has its ON/OFF controlled by an ON/OFF control voltage (gate-source voltage VGSL) of the low-side transistor QL and allows a current proportional to the current flowing in the low-side transistor QL to flow therein. The voltage conversion resistive element Rc converts the current flowing in the sense transistors QSh and QSl into the detection voltage VIS.

In FIG. 19, the error detector SUB detects an error between the detection voltage VIS and a target voltage TGT corresponding to a predetermined target current. The compensator PIC uses, for example, proportional (P) and integral (I) controls and the like to determine a PWM duty ratio such that an error between an average value of the detection voltage VIS (that is, the inductor current IL) and the target voltage TGT (that is, the target current) is brought close to zero. The PWM signal-generating circuit PWMG implements the PWM duty ratio and generates a high-side switching signal HS serving as a PWM signal that controls ON/OFF of the high-side transistor QH and a low-side switching signal LS which is a complementary signal (more specifically, including a dead-time period) of the high-side switching signal HS.

The pre-driver unit PDVU comprises pre-drivers PDVh and PDVl. The pre-driver PDVh operates by a power-supply potential VCC (that is, a high-side power-supply potential "VO+VCC") with an output potential VO generated at the output terminal PNo serving as a reference potential. The pre-driver PDVh receives the high-side switching signal HS and allows a gate potential VGH serving as a control input potential to be applied to a gate (control input node) of the high-side transistor QH. In other words, the pre-driver PDVh allows the gate-source voltage VGSH (=VGH−VO) serving as an ON/OFF control voltage to be applied between the gate and the source of the high-side transistor QH.

The pre-driver PDVl operates by the power-supply potential VCC with the ground power-supply potential GND serving as a reference potential. The pre-driver PDVl receives the low-side switching signal LS and allows a gate potential (control input potential) VGL to be applied to a gate of the low-side transistor QL. In other words, the pre-driver PDVl allows the gate-source voltage (ON/OFF control voltage) VGSL (=VGL) to be applied between the gate and the source of the low-side transistor QL.

Figure 21:
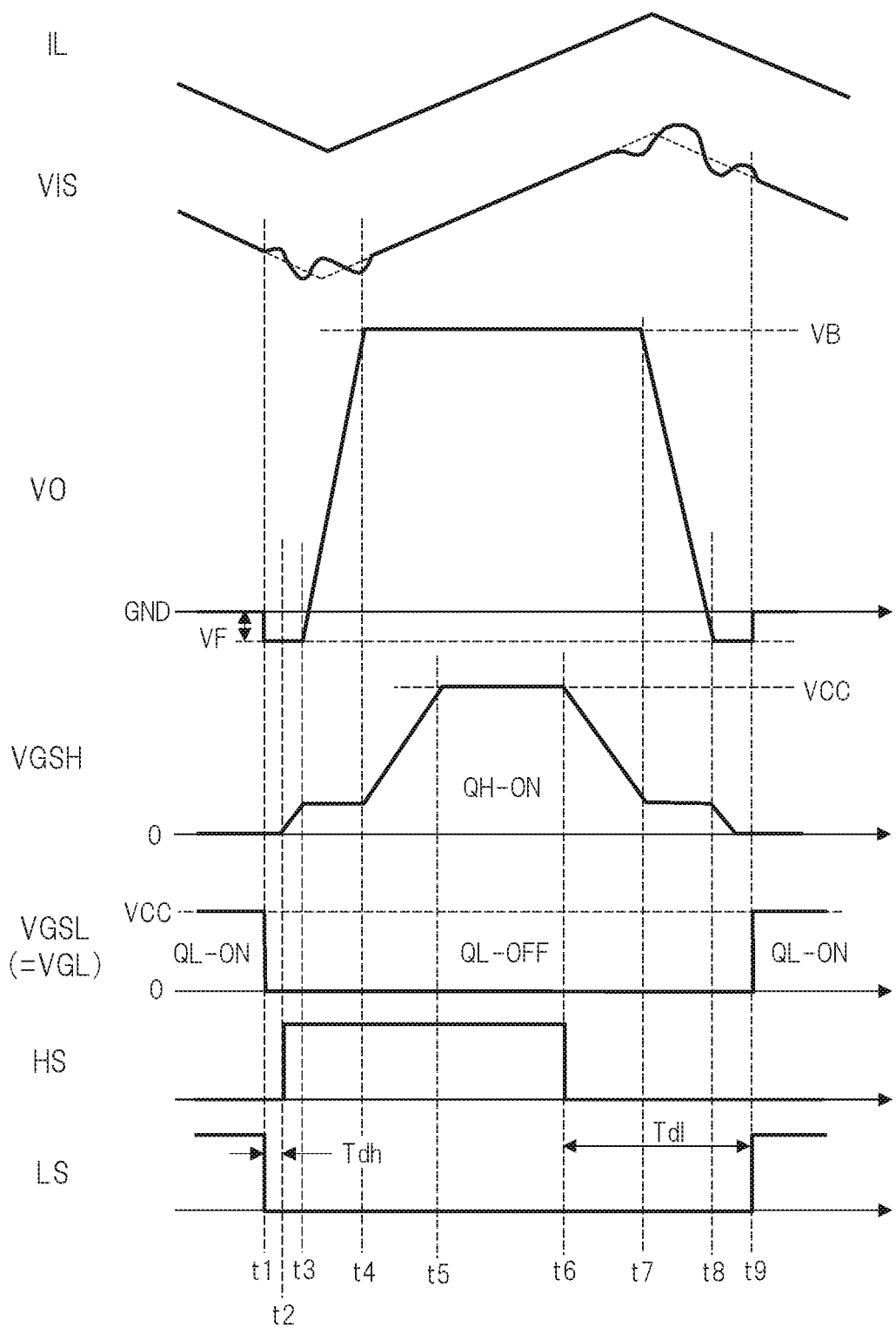
FIG. 21 is a waveform diagram schematically showing an operation example of the load drive system of FIG. 19.

FIG. 21 is a waveform diagram schematically showing an operation example of the load drive system of FIG. 19. In FIG. 21, prior to time t1, the high-side transistor QH is in an OFF-state, and the low-side transistor QL is in an ON-state. The low-side transistor QL in this state allows the return current to flow in the current path RPH of FIG. 19. Accordingly, the output potential VO changes to the ground power-supply potential GND level. During time t1 to time t2, the high-side transistor QH and the low-side transistor QL are both in the OFF-state as the low-side switching signal LS transitions from the ON-level to the OFF-level. In this state, the low-side freewheeling diode DL allows the return current to flow in place of the low-side transistor QL. Accordingly, the voltage of the output potential VO is decreased by a forward voltage VF of the freewheeling diode DL with respect to the ground power-supply potential GND serving as the reference potential.

During time t2 to time t3, the gate-source voltage VGSH of the high-side transistor QH rises as the high-side switching signal HS transitions from the OFF-level to the ON-level. At this time, since parasitic capacitance of the high-side transistor QH is large, the gate-source voltage VGSH gradually rises. At time t3, the high-side transistor QH is in a weak ON-state and allows the drive current to flow in the current path SPH instead of the current path RPH of FIG. 19. In addition, when the current path is switched as described above, the freewheeling diode DL is turned OFF, and the output potential VO starts to rise via the high-side transistor QH in the weak ON-state.

During time t3 to time t4, the output potential VO changes toward a substantial battery power-supply potential VB level. During this period, the gate-source voltage VGSH becomes substantially constant as the output potential VO changes. When the output potential VO reaches the substantial battery power-supply potential VB level at time t4, the gate-source voltage VGSH starts rising again. During time t4 to time t5, the gate-source voltage VGSH gradually rises toward the power-supply potential VCC level, and the high-side transistor QH shifts to a strong ON-state.

During time t6 to time t7, the gate-source voltage VGSH gradually falls as the high-side switching signal HS transitions from the ON-level to the OFF-level. When the gate-source voltage VGSH falls to a predetermined voltage level at time t7, the high-side transistor QH shifts to a weak ON-state, and the output potential VO starts to fall. During time t7 to time t8, the output potential VO changes toward a level that is lower than the ground power-supply potential GND level. During this period, the gate-source voltage VGSH becomes substantially constant as the output potential VO changes.

During time t8 to time t9, when the output potential VO reaches the value that has decreased by the forward voltage VF with respect to the ground power-supply potential GND level serving as the reference potential level, the low-side freewheeling diode DL is turned ON and allows the return current to flow in the current path RPH instead of the current path SPH. In addition, when the current path is switched as described above, the high-side transistor QH shifts from the weak ON-state to the OFF-state, and the gate-source voltage VGSH gradually decreases toward a zero-level. At time t9, the low-side transistor QL shifts to the ON-state and allows the return current to flow in place of the freewheeling diode DL as the low-side switching signal LS transitions from the OFF-level to the ON-level.

A period from time t1 to time t2 is a dead-time period Tdh associated with the ON operation of the high-side transistor QH (OFF operation of low-side transistor QL), and a period from time t6 to time t9 is a dead-time period Tdl associated with the ON operation of the low-side transistor QL (OFF operation of high-side transistor QH). The dead-time period Tdh is a period in which the value of the output potential VO is changed by the forward voltage VF such that the current path RPH of the return current is switched from the low-side transistor QL to the freewheeling diode DL. On the other hand, the dead-time period Tdl is a period in which the value of the output potential VO is changed by the substantial battery power-supply potential VB such that the current path SPH of the drive current flowed by the high-side transistor QH is switched to the current path RPH of the return current flowed by the freewheeling diode DL. Such a difference in the changed amount of the output potential VO causes the dead-time period Tdl to become longer than the dead-time period Tdh.

Here, the output potential VO changes during time t1 to time t4 and during time t7 to time t9 as described above. As shown in FIG. 21, when the output potential VO changes, the detection voltage VIS becomes such a value in which noise is superimposed on a voltage proportional to the inductor current IL. In addition, settling in the current detection circuit IDT may cause noise to be superimposed on the detection voltage VIS during time t4 to time t5 as well as during time t6 to time t7, depending on the circuit configuration.

The compensator PIC determines the PWM duty ratio such that, for example, the error between the average value of the detection voltage VIS and the target voltage TGT is brought close to zero. For this reason, noise occurring in the detection voltage VIS would cause the error associated with the average value of the detection voltage VIS to increase, whereby the inductor current IL would be controlled at a value deviated from the target voltage TGT (that is, the target current of the inductor current IL). As a result, it would be difficult to control the inductor current IL with high accuracy with respect to the target current. Thus, it is advantageous to use the configurations of the embodiments described below.

«Basic Configuration of Load Drive System (Main Embodiment)»

Figure 1:
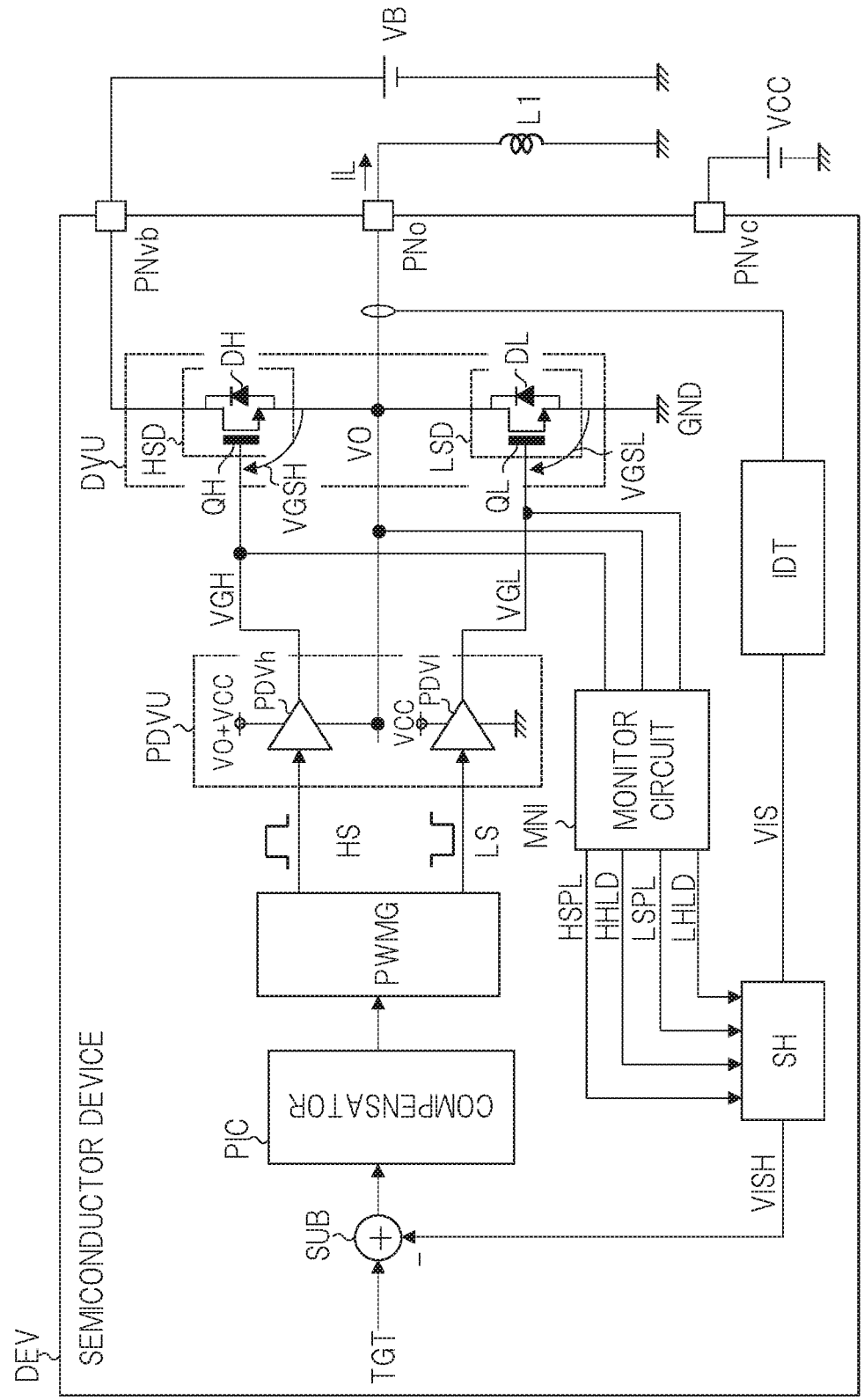
FIG. 1 is a schematic diagram showing a basic configuration example of a main part of a load drive system according to one embodiment of the present invention.

FIG. 1 is a schematic diagram showing a basic configuration example of a main part of a load drive system according to one embodiment of the present invention. The load drive system shown in FIG. 1 differs from the configuration example of FIG. 19 in that a semiconductor device DEV comprises a monitor circuit MNI and a sample-and-hold circuit SH. The monitor circuit MNI monitors the gate potential (control input potential) VGH applied to the gate (control input node) of the high-side transistor QH or monitors the output potential VO generated at the output terminal PNo. In addition, the monitor circuit MNI generates either one or both of a high-side sampling timing HSPL and a high-side holding timing HHLD based on the monitored result.

The monitor circuit MNI further monitors the gate potential VGL (that is, the gate-source voltage (ON/OFF control voltage) VGSL which is a potential difference between the gate potential VGL and the ground power-supply potential GND) applied to the gate of the low-side transistor QL. The monitor circuit MNI generates a low-side sampling timing LSPL and a low-side holding timing LHLD based on the monitored result.

The sample-and-hold circuit SH starts a sampling operation of the detection voltage VIS transmitted from the current detection circuit IDT in response to the high-side sampling timing HSPL and starts a holding operation of the detection voltage VIS in response to the high-side holding timing HHLD. In addition, the sample-and-hold circuit SH starts the sampling operation of the detection voltage VIS in response to the low-side sampling timing LSPL and starts the holding operation of the detection voltage VIS in response to the low-side holding timing LHLD. The sample-and-hold circuit SH performs the sampling and holding operations so as to output a detection voltage VISH. Unlike the case of FIG. 19, the error detector SUB detects an error between the detection voltage VISH and the target voltage TGT.

«Configuration of Load Drive System (First Embodiment)»

Figure 2:
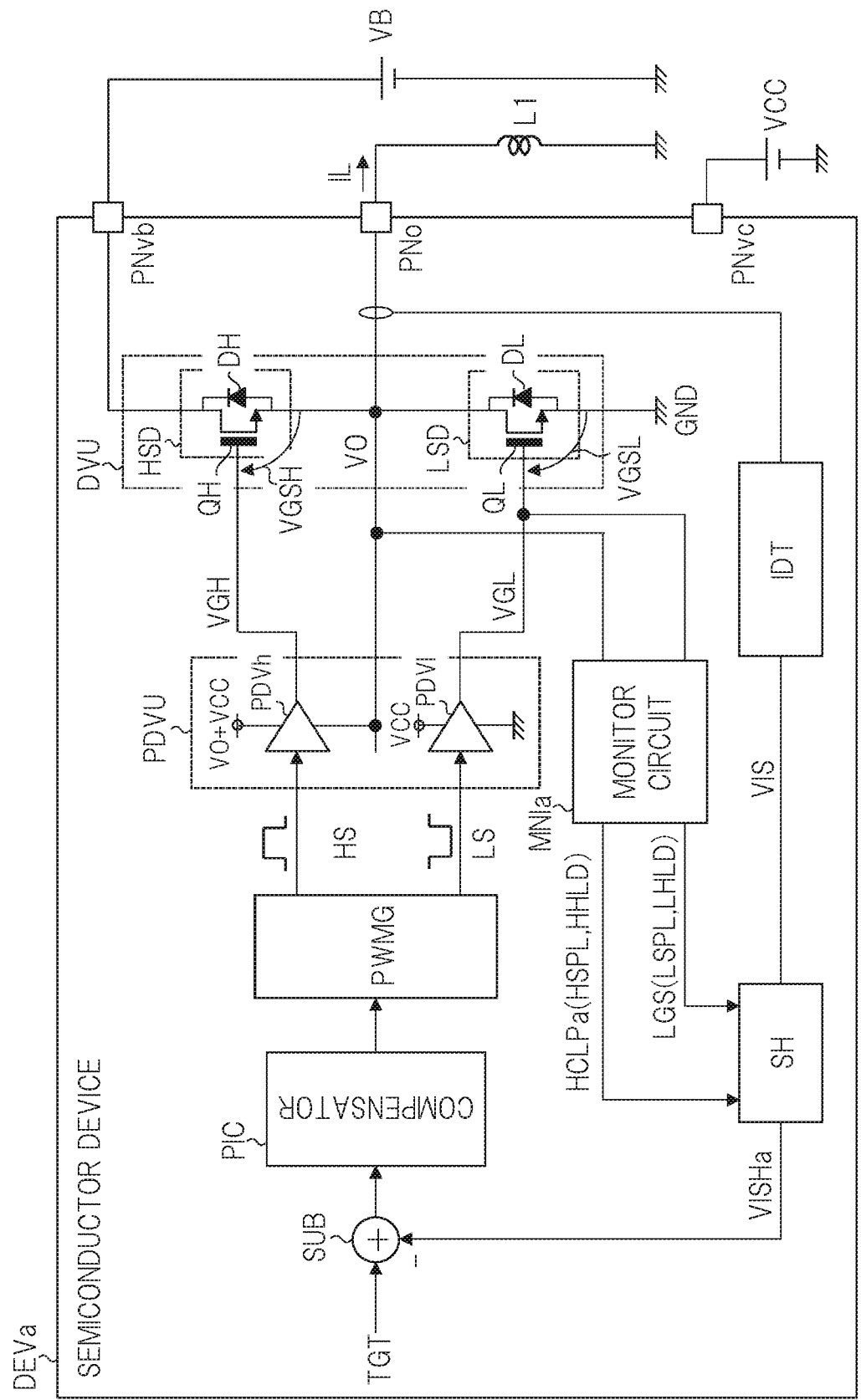
FIG. 2 is a schematic diagram showing a configuration example of a main part of a load drive system according to a first embodiment of the present invention.

FIG. 2 is a schematic diagram showing a configuration example of a main part of the load drive system according to a first embodiment of the present invention. In the load drive system of FIG. 2, a monitor circuit MNIa within a semiconductor device DEVa monitors the output potential VO at the output terminal PNo so as to generate a high-side clamp signal HCLPa. The high-side sampling timing HSPL and the high-side holding timing HHLD are respectively determined by a rising edge and a falling edge of the high-side clamp signal HCLPa.

In addition, the monitor circuit MNIa monitors the gate potential VGL (=gate-source voltage VGSL) of the low-side transistor QL so as to generate a low-side ON/OFF detection signal LGS. The low-side sampling timing LSPL and the low-side holding timing LHLD are respectively determined by a rising edge and a falling edge of the ON/OFF detection signal LGS. The sample-and-hold circuit SH performs sampling and holding operations using the corresponding timings (HSPL, HHLD, LSPL and LHLD) so as to output a detection voltage VISHa.

«Operation of Load Drive System (First Embodiment)»

Figure 3:
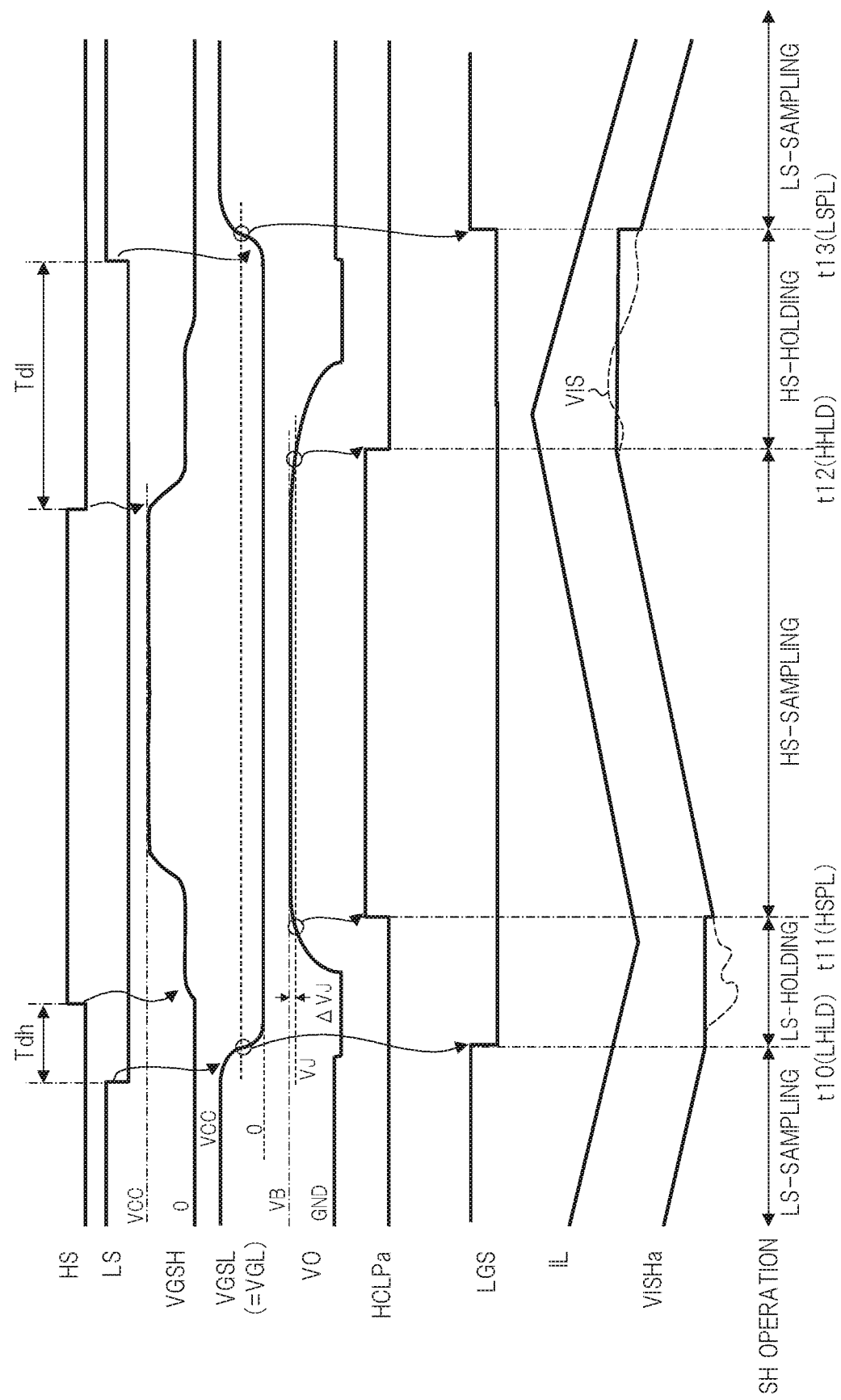
FIG. 3 is a waveform diagram showing an operation example of the load drive system of FIG. 2.

FIG. 3 is a waveform diagram showing an operation example of the load drive system of FIG. 2. During time t10 to time t11, the high-side switching signal HS transitions from an 'L' level (OFF-level) to an 'H' level (ON-level). In response, the output potential VO rises toward the battery power-supply potential VB, with the gate-source voltage VGSH in a substantially constant state (the high-side transistor QH in the weak ON-state) as described with reference to FIG. 21.

At time t11, the output potential VO rises to a determination potential VJ which is a potential level in the vicinity of the battery power-supply potential VB. When the output potential VO has risen to the determination potential VJ, the monitor circuit MNIa allows the high-side clamp signal HCLPa to rise so as to generate the high-side sampling timing HSPL. The determination potential VJ is set to a value that is lower than, for example, the battery power-supply potential VB by a determination margin voltage $\Delta$VJ. The determination margin voltage $\Delta$VJ is set to a value (such as approximately 5 V) that is lower than approximately 40% of the battery power-supply potential VB (such as 13 V) and is set to the same magnitude (such as 3.3 V) and the like as, for example, the power-supply potential VCC.

During time t11 to time t12, the high-side switching signal HS transitions from the 'H' level to the 'L' level. In response, the output potential VO falls toward a potential level that is lower than the ground power-supply potential GND by the forward voltage VF, with the gate-source voltage VGSH in a substantially constant state (the high-side transistor QH in the weak ON-state) as described with reference to FIG. 21. At time t12 during this process, the output potential VO falls to the determination potential VJ. When the output potential VO has fallen to the determination potential VJ (that is, when the output potential VO starts to fall), the monitor circuit MNIa allows the high-side clamp signal HCLPa to fall so as to generate the high-side holding timing HHLD.

During time t12 to time t13, the low-side switching signal LS transitions from the 'L' level (OFF-level) to the 'H' level (ON-level). In response, the gate-source voltage VGSL (=gate potential VGL) of the low-side transistor QL rises toward the power-supply potential VCC as described with reference to FIG. 21. At time t13, the monitor circuit MNIa detects the rise in the gate-source voltage VGSL and, in response, allows the ON/OFF detection signal LGS to rise so as to generate the low-side sampling timing LSPL. Note that a determination threshold for detecting this rise is set, for example, in the vicinity of an intermediate power-supply potential VCC level.

During time t13 to time t10, the low-side switching signal LS transitions from the 'H' level to the 'L' level. In response, the gate-source voltage VGSL (=gate potential VGL) of the low-side transistor QL falls toward the zero-level as described with reference to FIG. 21. At time t10, the monitor circuit MNIa detects the fall in the gate-source voltage VGSL and, in response, allows the ON/OFF detection signal LGS to fall so as to generate the low-side holding timing LHLD. As in the case of detecting the rise, the determination threshold for detecting this fall is set, for example, in the vicinity of the intermediate power-supply potential VCC level.

Through such series of operations, the sample-and-hold circuit SH outputs the detection voltage VIS held at time t12 as the detection voltage VISHa during time t12 to time t13, and outputs the detection voltage VIS held at time t10 as the detection voltage VISHa during time t10 to time t11. As a result, the detection voltage VISHa does not include noise components as described with reference to FIG. 21, so that the inductor current IL can be detected with high accuracy. In addition, this reduces the error associated with the average value of the detection voltage VISHa, so that the inductor current IL can be controlled with high accuracy with respect to the target voltage TGT (that is, the target current of the inductor IL).

It is possible to consider another configuration in which, for example, the high-side switching signal HS and the low-side switching signal LS are used to determine each sampling timing and each holding timing. However, in this case, it would be difficult to precisely avoid a period in which noise occurs. It is also possible to consider another configuration in which, for example, the gate-source voltage VGSH of the high-side transistor QH is monitored to determine the high-side sampling timing (HSPL) and the high-side holding timing (HHLD) during the period in which the gate-source voltage VGSH is at the power-supply potential VCC. However, although noise can be avoided in this case, the high-side sampling period (HS-sampling period) would be extremely short, causing a possible increase in the error associated with the average value of the detection voltage VISHa. From such a viewpoint, it is advantageous to use the configuration of FIG. 2.

«Details of Monitor Circuit and Surroundings»

Figure 4:
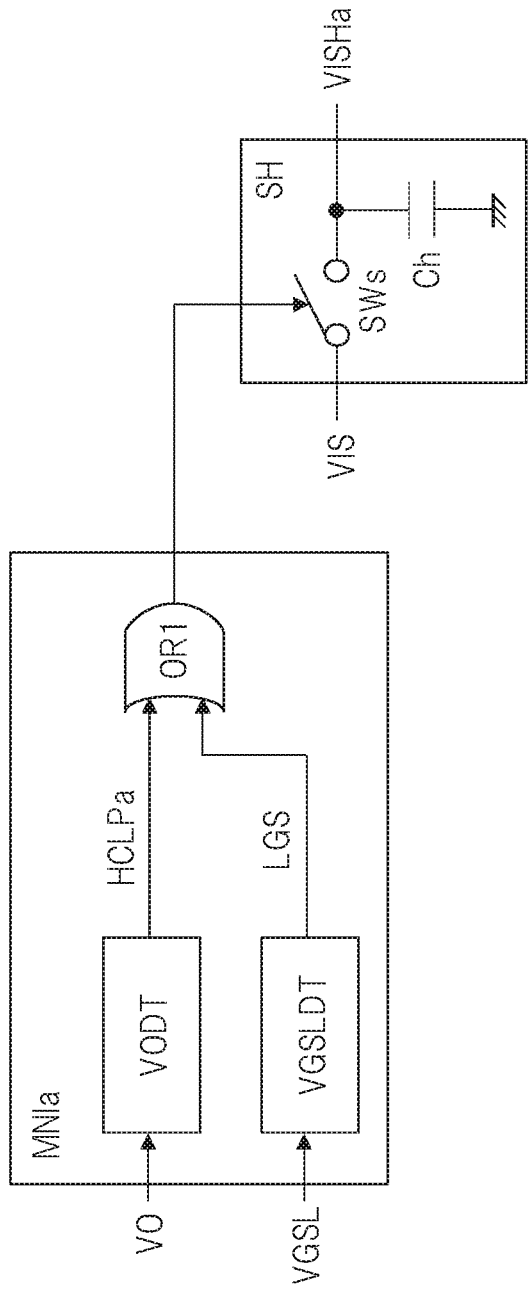
FIG. 4 is a block diagram showing a configuration example of a monitor circuit of FIG. 2 and its surroundings.

FIG. 4 is a block diagram showing a configuration example of the monitor circuit of FIG. 2 and its surroundings. In FIG. 4, the sample-and-hold circuit SH comprises a sampling switch SWs coupled between the detection voltage VIS transmitted from the current detection circuit IDT and the detection voltage VISHa transmitted to the error detector SUB, and a capacitor Ch that holds the detection voltage VISHa. The monitor circuit MNIa comprises an output potential detection circuit VODT, a low-side ON/OFF detection circuit VGSLDT, and an OR gate OR1.

The output potential detection circuit VODT monitors the output potential VO so as to output the high-side clamp signal HCLPa. The low-side ON/OFF detection circuit VGSLDT monitors the gate-source voltage VGSL of the low-side transistor QL so as to output the ON/OFF detection signal LGS. The low-side ON/OFF detection circuit VGSLDT is specifically constituted by a CMOS inverter circuit and the like which receives, for example, the gate-source voltage VGSL as an input. The OR gate OR1 performs an OR operation of the high-side clamp signal HCLPa and ON/OFF detection signal LGS and controls ON/OFF of the sampling switch SWs based on the result of the OR operation.

Figure 5A:
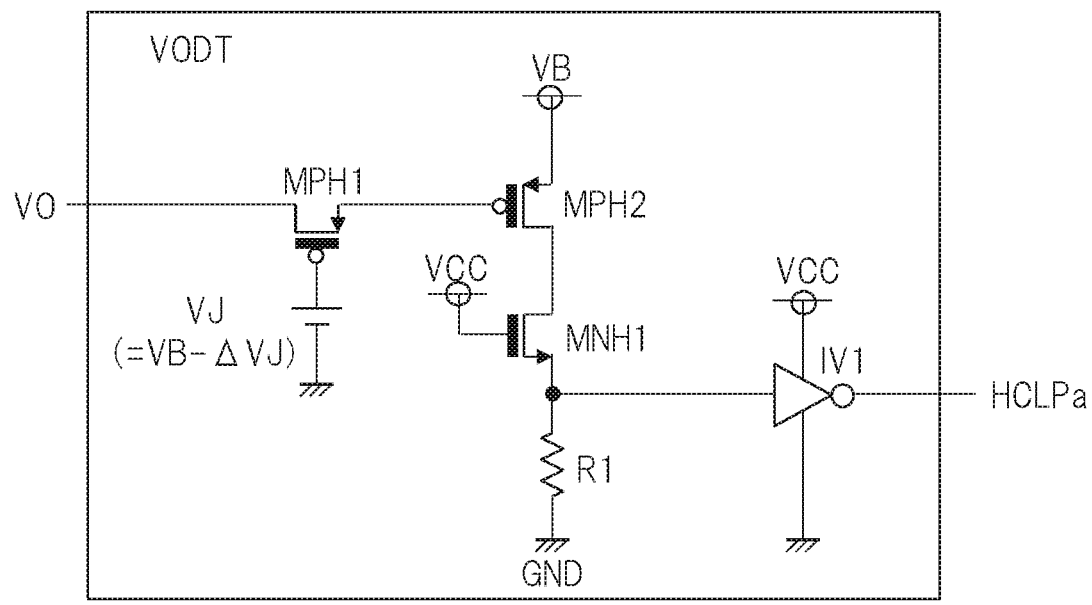
FIG. 5A is a circuit diagram showing a configuration example of an output potential detection circuit of FIG. 4.
Figure 5B:
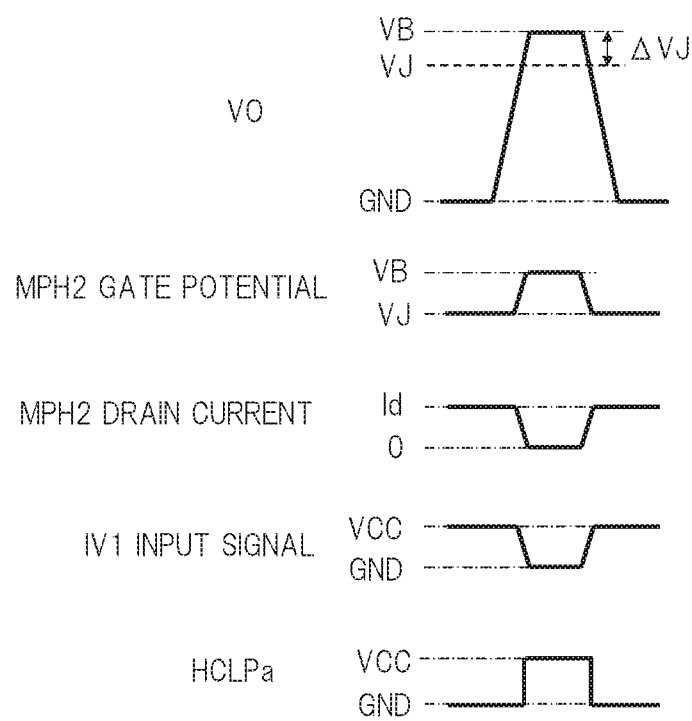
FIG. 5B is a waveform diagram schematically showing an operation example of FIG. 5A.

FIG. 5A is a circuit diagram showing a configuration example of the output potential detection circuit of FIG. 4, and FIG. 5B is a waveform diagram schematically showing an operation example of FIG. 5A. The output potential detection circuit VODT shown in FIG. 5A comprises p-channel type transistors MPH1 and MPH2, an n-channel type transistor MNH1, a resistive element R1, a CMOS inverter circuit IV1, and a voltage source that generates the determination potential VJ. The transistors MPH1, MPH2 and MNH1 are constituted by a high-withstand voltage MOSFET and the like. On the other hand, the CMOS inverter circuit IV1 is constituted by a low-withstand voltage MOSFET and the like.

The output potential VO is applied to a drain of the transistor MPH1, and the determination potential VJ is applied to a gate of the transistor MPH1. By this configuration, the transistor MPH1 functions as a clamp transistor that clamps the output potential VO at the determination potential VJ serving as the lower limit value and outputs the clamped potential from the source. More specifically, a threshold voltage is present in the transistor MPH1, so that the potential applied to the gate is determined as a value that is lower than the determination potential VJ by the threshold voltage. Hereinafter, influence of such threshold voltage will be disregarded for the sake of easily describing the invention.

The battery power-supply potential VB is applied to a source of the transistor MPH2, and the clamped potential transmitted from the transistor MPH1 (that is, a signal that changes between the battery power-supply potential VB and the determination potential VJ) is applied to a gate of the transistor MPH2. In response, the transistor MPH2 outputs a predetermined drain current signal Id. The drain current signal Id is applied to the resistive element R1 via the transistor MNH1.

The resistive element R1 converts the drain current signal Id into a voltage signal. At this time, the power-supply potential VCC is applied to the gate of the transistor MNH1, so that the transistor MNH1 clamps a source potential (that is, an upper limit value of the voltage signal converted by the resistive element R1) at the power-supply potential VCC serving as an upper limit value. The CMOS inverter circuit IV1 operates by the power-supply potential VCC and the ground power-supply potential GND, receives the voltage signal from the resistive element R1 as an input, and outputs the high-side clamp signal HCLPa.

In this manner, using the clamp transistor (MPH1) that receives the determination potential VJ as agate input to configure the output potential detection circuit VODT makes it possible to simplify the circuit configuration and reduce a circuit area. Specifically, a more advantageous effect can be obtained as compared to a case where a conventional comparator constituted by, for example, a differential amplifier circuit or the like including the high-withstand voltage MOSFET is used.

«Method of Detecting Inductor Current (First Embodiment)»

Figure 6:
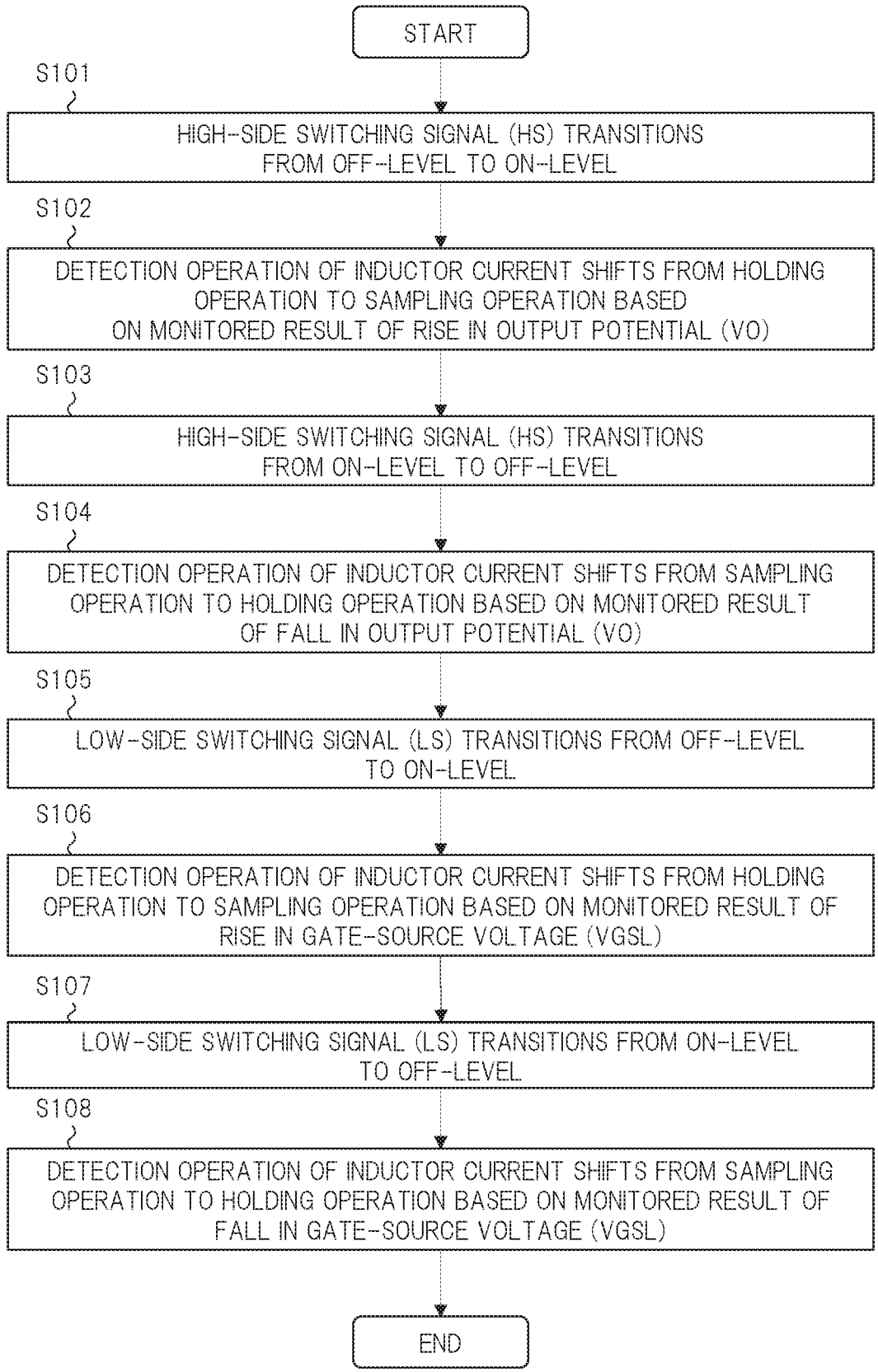
FIG. 6 is a flowchart showing an example of a method of detecting an inductor current in the load drive system according to the first embodiment of the present invention.

FIG. 6 is a flowchart showing an example of a method of detecting the inductor current in the load drive system according to the first embodiment of the present invention. For example, the current detection circuit IDT, the sample-and-hold circuit SH and the monitor circuit MNIa of FIG. 2 function as a current detection unit that detects the inductor current IL by the sampling and holding operations. FIG. 6 shows an example of processing contents of the current detection unit.

In FIG. 6, the high-side switching signal HS first transitions from the OFF-level to the ON-level (step S101). Accordingly, the current detection unit allows the detection operation of the inductor current IL to shift from the holding operation to the sampling operation based on the monitored result of the rise in the output potential VO (step S102). Specifically, the current detection unit monitors whether the output potential VO has risen to the determination potential VJ.

Next, the high-side switching signal HS transitions from the ON-level to the OFF-level (step S103). Accordingly, the current detection unit allows the detection operation of the inductor current IL to shift from the sampling operation to the holding operation based on the monitored result of the fall in the output potential VO (step S104). Specifically, the current detection unit monitors whether the output potential VO has fallen to the determination potential VJ.

Next, the low-side switching signal LS transitions from the OFF-level to the ON-level (step S105). Accordingly, the current detection unit allows the detection operation of the inductor current IL to shift from the holding operation to the sampling operation based on the monitored result of the rise in the gate-source voltage VGSL (step S106). Specifically, the current detection unit monitors whether, for example, the gate-source voltage VGSL has risen to an intermediate amplitude level.

Next, the low-side switching signal LS transitions from the ON-level to the OFF-level (step S107). Accordingly, the current detection unit allows the detection operation of the inductor current IL to shift from the sampling operation to the holding operation based on the monitored result of the fall in the gate-source voltage VGSL (step S108). Specifically, the current detection unit monitors whether, for example, the gate-source voltage VGSL has fallen to the intermediate amplitude level. Thereafter, the process returns to step S101 and is repeated in the same manner.

«Application Example of Load Drive System (First Embodiment)»

Figure 7:
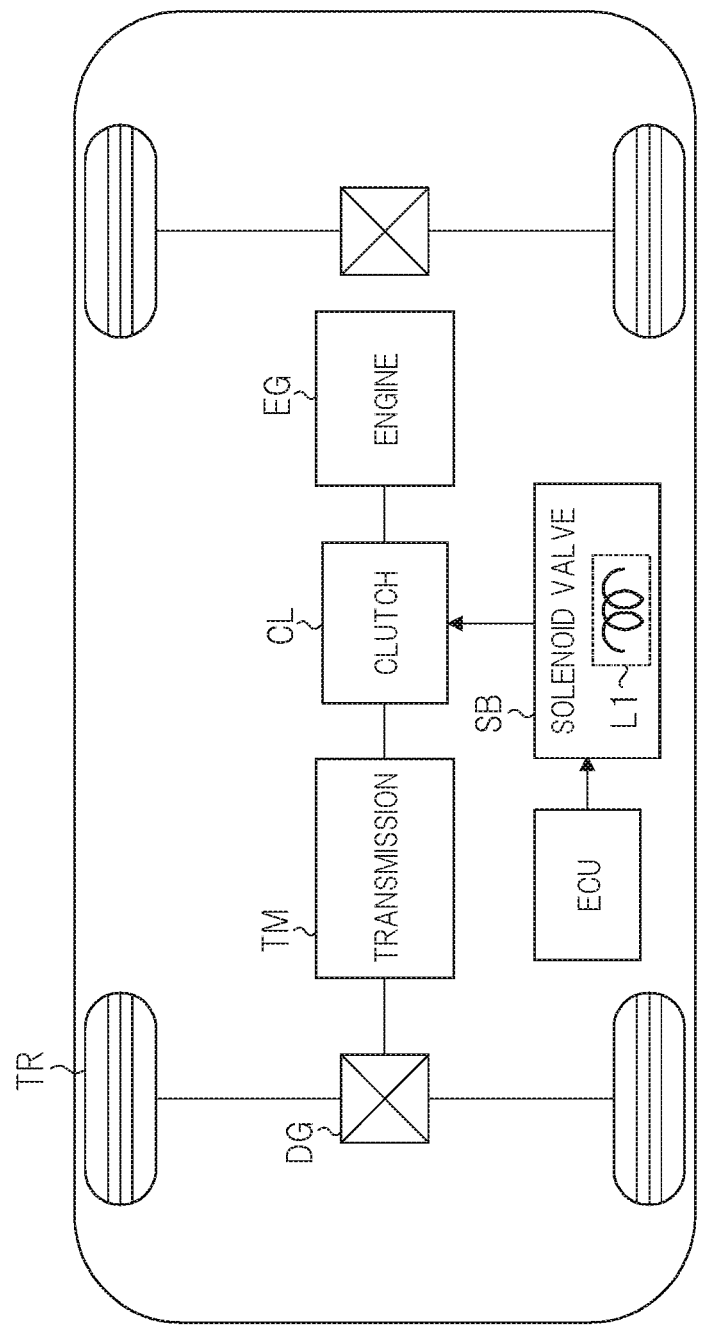
FIG. 7 is a schematic diagram showing a configuration example of an automobile to which the load drive system according to the first embodiment of the present invention is applied.

FIG. 7 is a schematic diagram showing a configuration example of an automobile to which the load drive system according to the first embodiment of the present invention is applied. The automobile shown in FIG. 7 comprises tires TR, a differential gear DG, a transmission TM, a clutch CL, an engine EG, a solenoid valve SB, an electronic control device ECU and the like. The solenoid valve SB includes the inductor L1 and controls hydraulic pressure of the clutch CL in response to the inductor current flowing in the inductor L1.

Figure 8:
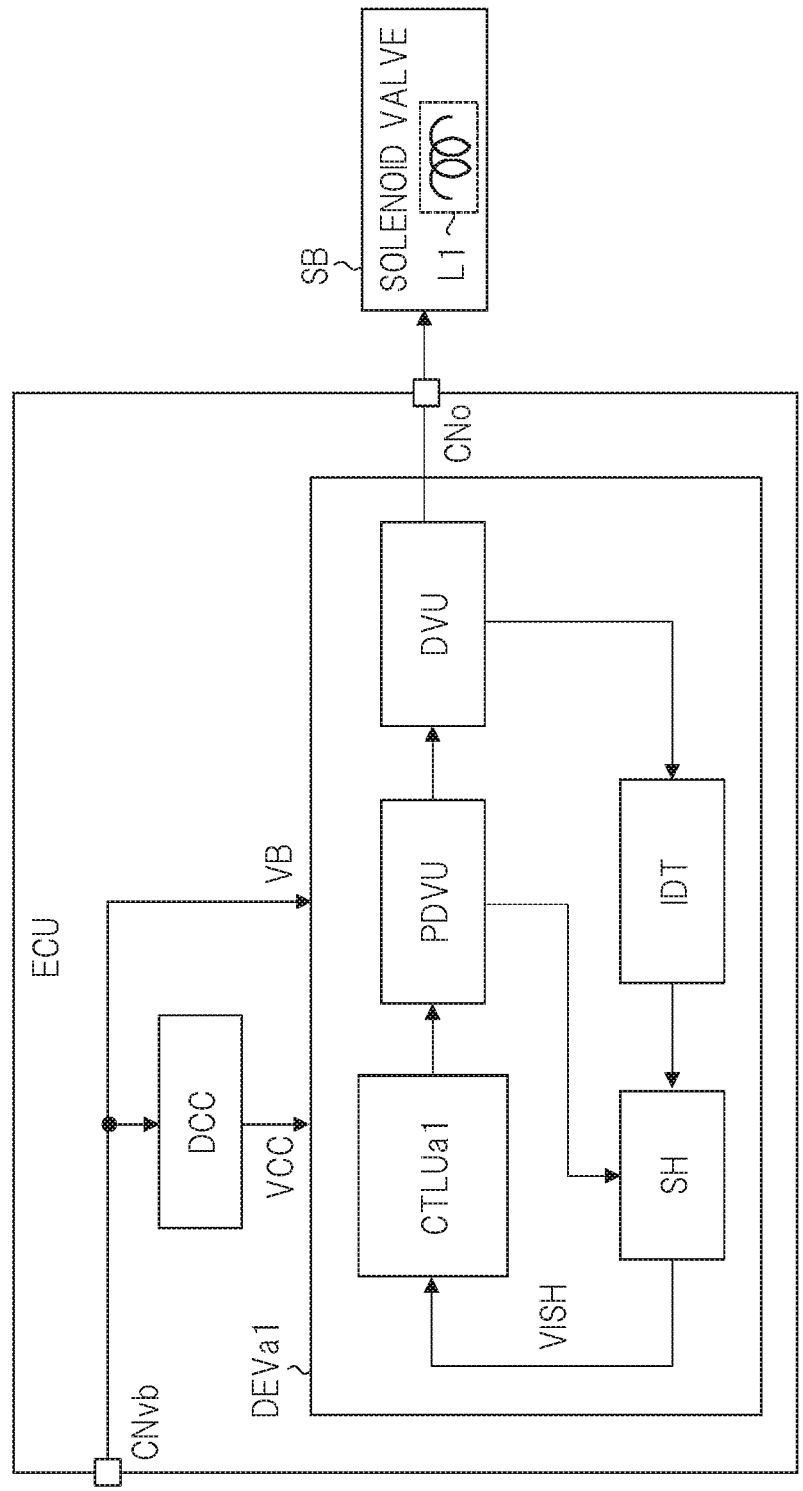
FIG. 8 is a schematic diagram showing a configuration example of an electronic control device of FIG. 7.

FIG. 8 is a schematic diagram showing a configuration example of the electronic control device of FIG. 7. The electronic control device ECU shown in FIG. 8 is constituted by, for example, a wiring substrate and the like on which a DC-DC converter DCC, a semiconductor device DEVa1 and the like are mounted. The DC-DC converter DCC receives the battery power-supply potential VB (such as 13 V) from an external connector CNvb and generates the power-supply potential VCC (such as 3.3 V).

The semiconductor device DEVa1 has a configuration as shown in FIG. 2 and operates by receiving the battery power-supply potential VB and the power-supply potential VCC. A control circuit CTLUa1 within the semiconductor device DEVa1 comprises the error detector SUB, the compensator PIC and the PWM signal-generating circuit PWMG of FIG. 2. The semiconductor device DEVa1 controls the current in the solenoid valve SB via the external connector CNo such that the detection voltage VISH transmitted from the sample-and-hold circuit SH (that is, the current in the solenoid valve SB) becomes equal to the target voltage (target current).

Figure 9:
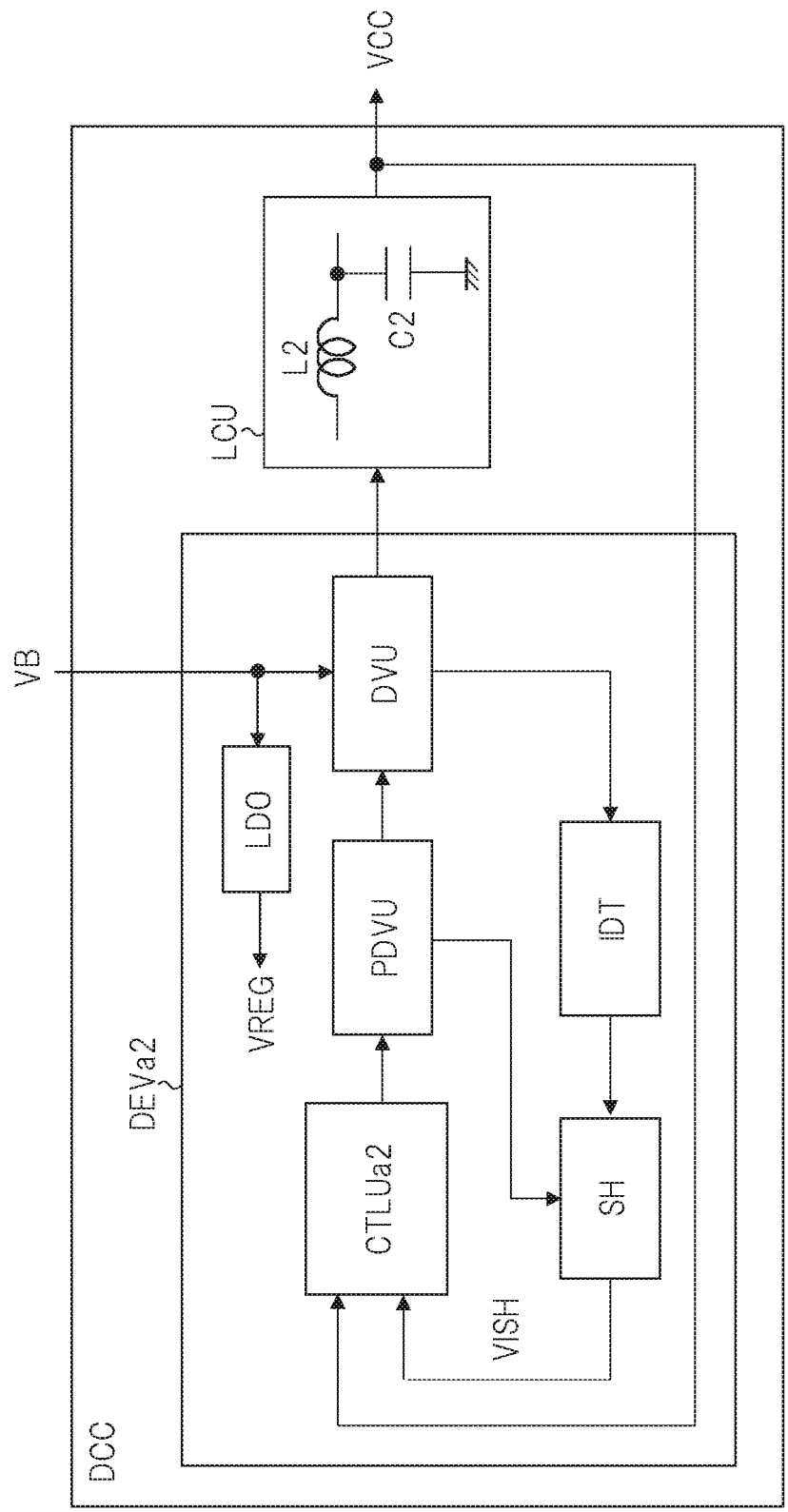
FIG. 9 is a schematic diagram showing a configuration example of a DC-DC converter of FIG. 8.

FIG. 9 is a schematic diagram showing a configuration example of the DC-DC converter of FIG. 8. The DC-DC converter DCC shown in FIG. 9 comprises a semiconductor device DEVa2 and an LC circuit unit LCU. The LC circuit unit LCU comprises an inductor L2 and a smoothing capacitor C2 and outputs the power-supply potential VCC. The semiconductor device DEVa2 has an overall configuration as shown in FIG. 2 and operates by receiving the battery power-supply potential VB. However, unlike the configuration example of FIG. 2, the semiconductor device DEVa2 controls the power-supply potential VCC instead of the current in the inductor L2.

In this example, the semiconductor device DEVa2 comprises an internal power-supply regulator (series regulator) LDO for generating an internal power-supply potential VREG corresponding to the power-supply potential VCC shown in FIG. 2. Further, in addition to the detection voltage VISH (that is, the inductor current in the inductor L2), the power-supply potential VCC is fed back to a control circuit CTLUa2 within the semiconductor device DEVa2. The control circuit CTLUa2 comprises a voltage control loop and a current control loop provided inside the voltage control loop. The control circuit CTLUa2 detects the error between the power-supply potential VCC and the predetermined target voltage at the voltage control loop and transmits the detected result and the detection voltage VISH transmitted from the sample-and-hold circuit SH to the current control loop so as to generate a PWM signal.

In FIG. 7, in order to perform gear shift smoothly in, for example, an automatic-transmission (AT) vehicle or the like, it is preferable that the hydraulic pressure of the clutch CL is controlled with high accuracy. Therefore, in FIG. 8, it is preferable that the current in the solenoid valve SB is controlled with high accuracy, so that accuracy of current detection is enhanced. Using the load drive system of the first embodiment allows such requirements to be satisfied and performance of the automobile to be improved.

In addition, as shown in FIG. 9, applying the load drive system of the first embodiment to the DC-DC converter allows feedback control to be performed by using the detection voltage VISH from which noise components have been removed. The above has described examples in which the present invention is applied to a solenoid valve and a DC-DC converter. However, the present invention is not limited to these examples and can be widely applied to systems using an inductor as the load such as, for example, a control system of various actuators for a motor and the like.

«Main Effect of First Embodiment»

As described above, using the configuration of the first embodiment generally allows an inductor current to be detected with high accuracy. As a result, the inductor current can be controlled with high accuracy. In particular, controlling the current in the solenoid valve with using the configuration of the first embodiment allows performance of the automobile to be improved.

(Second Embodiment)

«Configuration of Load Drive System (Second Embodiment)»

Figure 10:
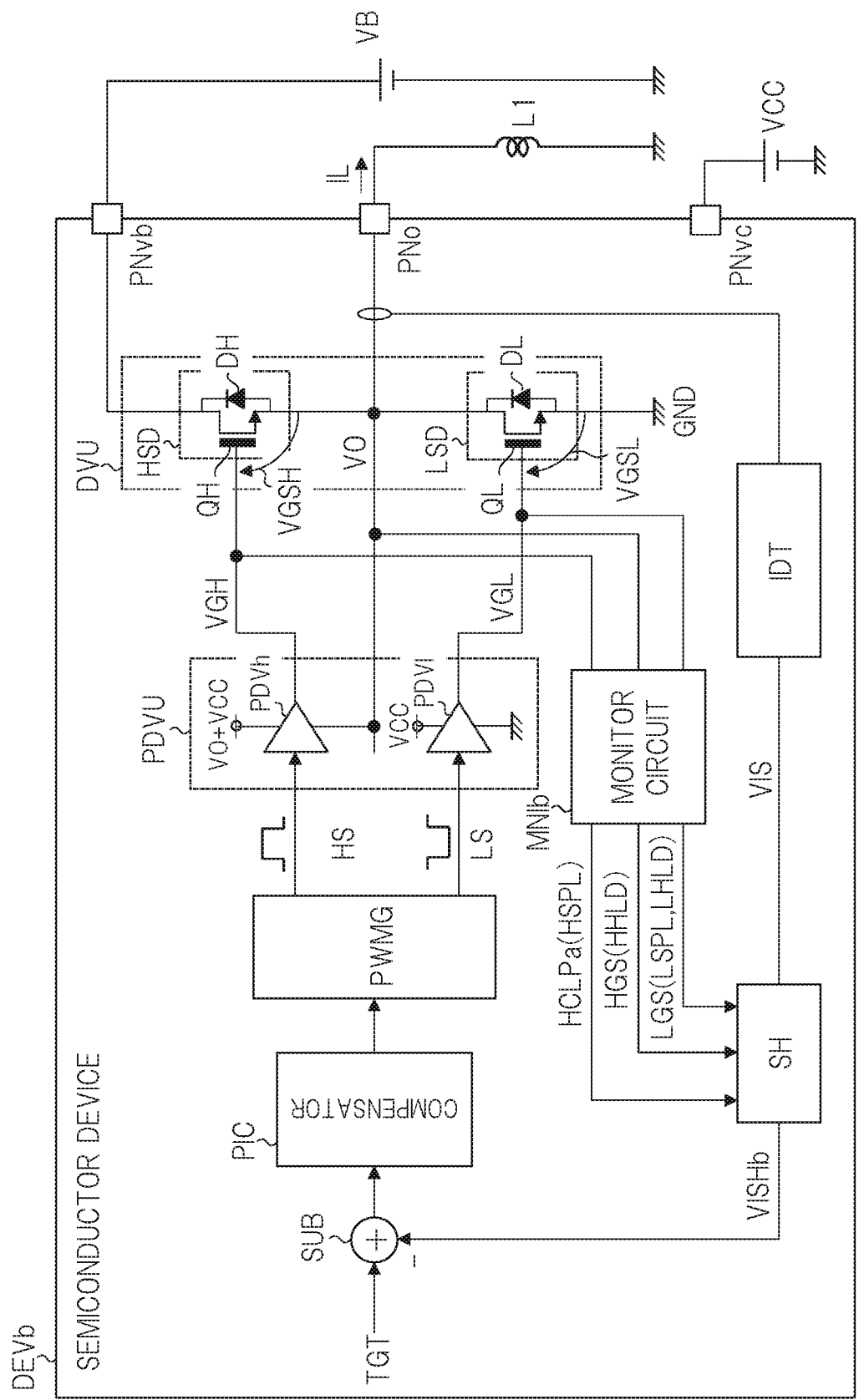
FIG. 10 is a schematic diagram showing a configuration example of a main part of a load drive system according to a second embodiment of the present invention.

FIG. 10 is a schematic diagram showing a configuration example of a main part of the load drive system according to a second embodiment of the present invention. The load drive system shown in FIG. 10 differs from the configuration example of FIG. 2 in configuration of a monitor circuit MNIb within a semiconductor device DEVb. As in the case of FIG. 2, the monitor circuit MNIb monitors the output potential VO at the output terminal PNo so as to generate the high-side clamp signal HCLPa and monitors the gate potential VGL (=the gate-source voltage VGSL) of the low-side transistor QL so as to generate the low-side ON/OFF detection signal LGS. Unlike the case of FIG. 2, the monitor circuit MNIb further monitors the gate-source voltage VGSH of the high-side transistor QH so as to generate a high-side ON/OFF detection signal HGS.

As in the case of FIG. 2, the high-side sampling timing HSPL is determined by the rising edge of the high-side clamp signal HCLPa, and the low-side sampling timing LSPL and the low-side holding timing LHLD are determined based on the low-side ON/OFF detection signal LGS. On the other hand, unlike the case of FIG. 2, the high-side holding timing HHLD is determined based on the high-side ON/OFF detection signal HGS. The sample-and-hold circuit SH performs sampling and holding operations using the corresponding timings (HSPL, HHLD, LSPL and LHLD) so as to output a detection voltage VISHb.

«Operation of Load Drive System (Second Embodiment)»

Figure 11:
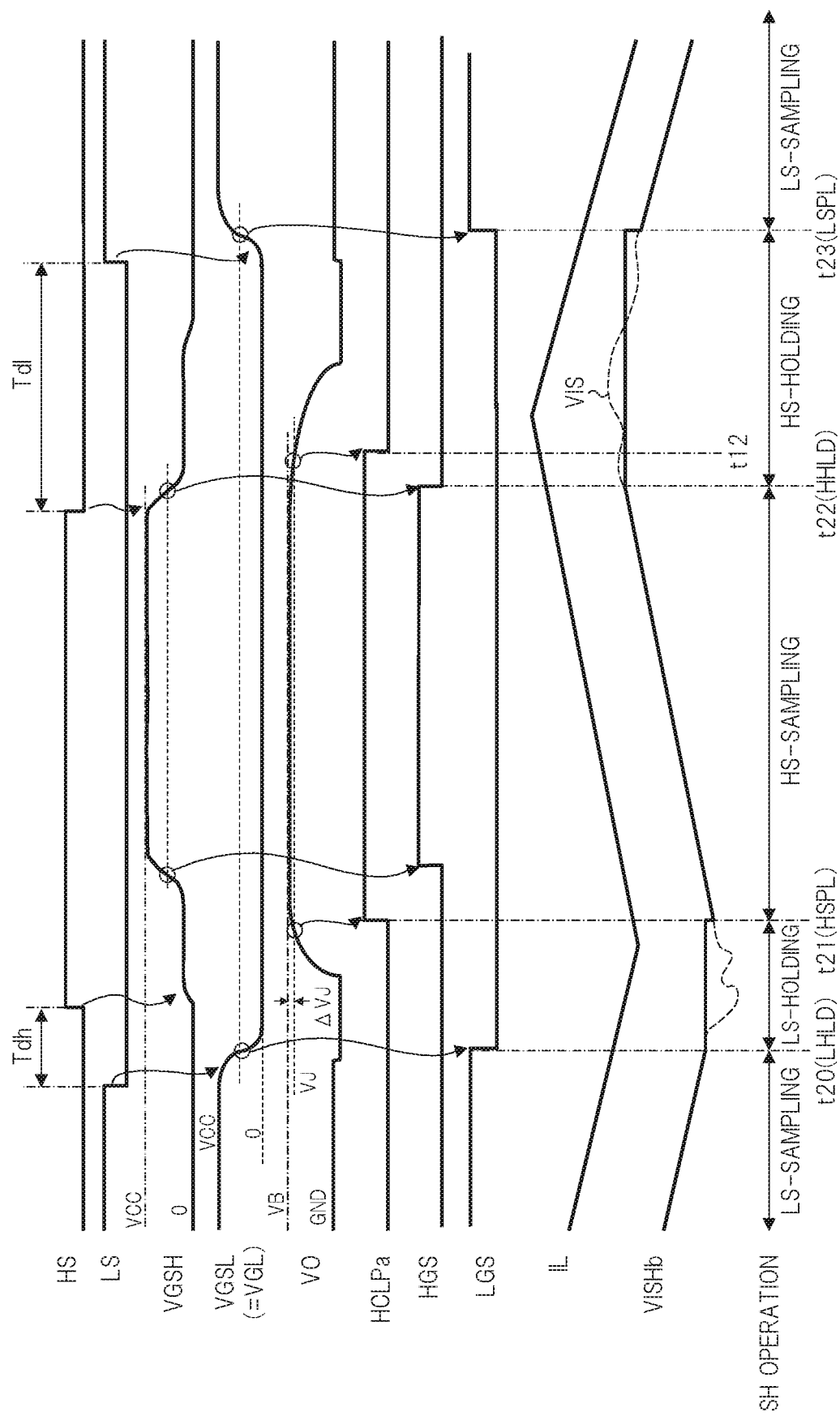
FIG. 11 is a waveform diagram showing an operation example of the load drive system of FIG. 10.

FIG. 11 is a waveform diagram showing an operation example of the load drive system of FIG. 10. Time t20 to time t23 of FIG. 11 respectively correspond to time t10 to time t13 of FIG. 3. However, at time t22, the high-side holding timing HHLD is determined by the falling edge of the high-side ON/OFF detection signal HGS, unlike the case at time t12. The gate-source voltage VGSH (=VGH–VO) of the high-side transistor QH rises from the zero-level to the power-supply potential VCC level in response to the high-side switching signal HS transitioning to the 'H' level and falls from the power-supply potential VCC level to the zero-level in response to the high-side switching signal HS transitioning to the 'L' level.

The monitor circuit MNIb detects the rise in the gate-source voltage VGSH and, in response, allows the ON/OFF detection signal HGS to rise. In addition, at time t22, the monitor circuit MNIb detects the fall in the gate-source voltage VGSH and, in response, allows the ON/OFF detection signal HGS to fall so as to generate the high-side holding timing HHLD. Note that the determination threshold for detecting the rise and fall is set, for example, in the vicinity of the intermediate power-supply potential VCC level.

As described with reference to FIG. 21, noise is likely to be superimposed on the detection voltage VIS transmitted from the current detection circuit IDT during the period from which the output potential VO starts to rise to which the gate-source voltage VGSH finishes rising (during time t4 to time t5 of FIG. 21, and at and after time t21 of FIG. 11). In addition, noise is likely to be superimposed on the detection voltage VIS during the period from which the gate-source voltage VGSH starts to fall to which the output potential VO starts to fall (during time t6 to time t7 of FIG. 21, and at and before time t12 of FIG. 11).

Noise occurring at and after time t21 can be removed by, for example, slightly delaying the high-side sampling timing HSPL. On the other hand, noise occurring at and before time t12 would be difficult to remove in the configuration of FIG. 3. Thus, in the configuration of the second embodiment, the high-side holding timing HHLD is generated based on the ON/OFF detection signal HGS, so that the noise is removed.

«Details of Monitor Circuit and its Surroundings»

Figure 12:
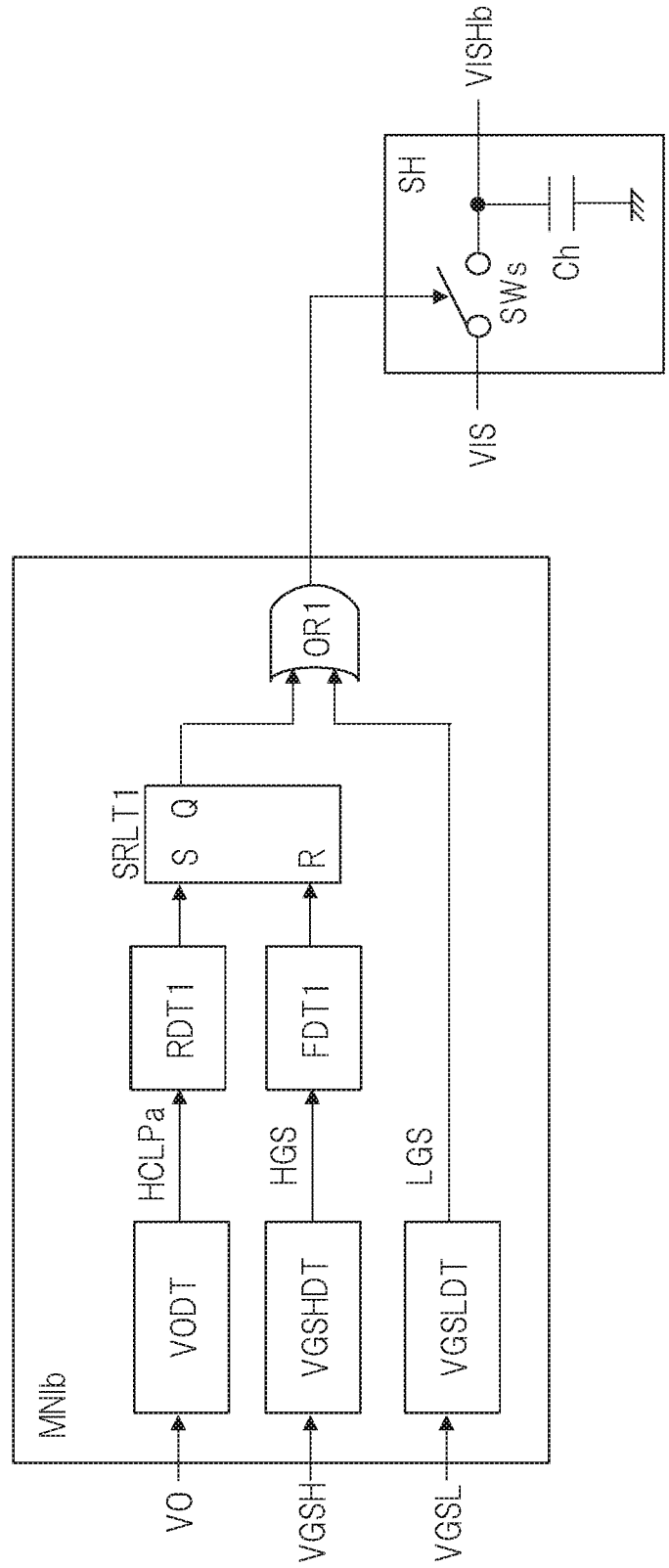
FIG. 12 is a block diagram showing a configuration example of a monitor circuit of FIG. 10 and its surroundings.

FIG. 12 is a block diagram showing a configuration example of the monitor circuit of FIG. 10 and its surroundings. The monitor circuit MNIb shown in FIG. 10 differs from the configuration example of FIG. 4 in that it further comprises a high-side ON/OFF detection circuit VGSHDT, a rising-edge detection circuit RDT1, a falling-edge detection circuit FDT1, and a set-reset latch circuit SRLT1. The high-side ON/OFF detection circuit VGSHDT monitors the gate-source voltage VGSH of the high-side transistor QH so as to output the ON/OFF detection signal HGS.

The rising-edge detection circuit RDT1 detects the rising edge of the high-side clamp signal HCLPa transmitted from the output potential detection circuit VODT and outputs a one-shot pulse signal. The falling-edge detection circuit FDT1 detects the falling edge of the ON/OFF detection signal HGS transmitted from the high-side ON/OFF detection circuit VGSHDT and outputs a one-shot pulse signal. The set-reset latch circuit SRLT1 performs a setting operation based on the one-shot pulse signal transmitted from the rising-edge detection circuit RDT1 and performs a resetting operation based on the one-shot pulse signal transmitted from the falling-edge detection circuit FDT1. An output signal transmitted from the set-reset latch circuit SRLT1 and the ON/OFF detection signal LGS transmitted from the low-side ON/OFF detection circuit VGSLDT are inputted to the OR gate OR1.

Figure 13A:
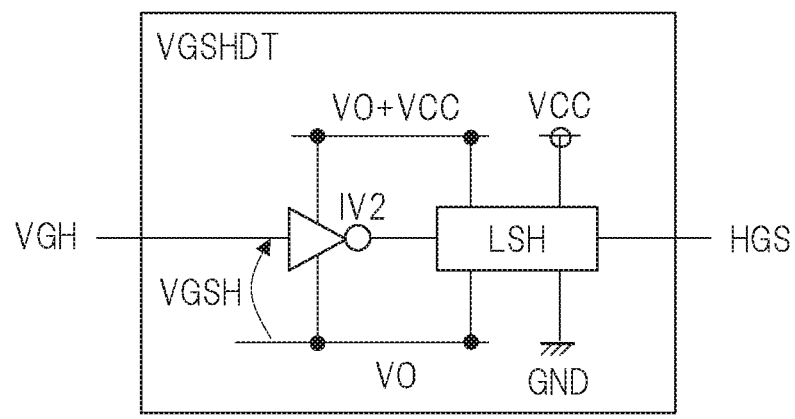
FIG. 13A is a circuit diagram showing a configuration example of a high-side ON/OFF detection circuit of FIG. 12.
Figure 13B:
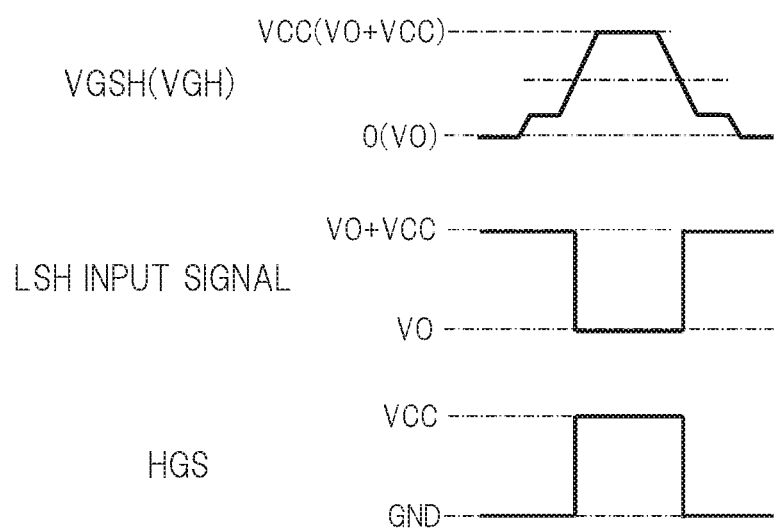
FIG. 13B is a waveform diagram schematically showing an operation example of FIG. 13A.

FIG. 13A is a circuit diagram showing a configuration example of the high-side ON/OFF detection circuit of FIG. 12, and FIG. 13B is a waveform diagram schematically showing an operation example of FIG. 13A. The high-side ON/OFF detection circuit VGSHDT shown in FIG. 13A comprises a CMOS inverter circuit IV2 and a level shifter circuit LSH. The CMOS inverter circuit IV2 is constituted by, for example, a low-withstand voltage MOSFET, and operates by the high-side power-supply potential "VO+VCC" with the output potential VO serving as the reference potential.

The gate potential VGH that changes between the high-side power-supply potential "VO+VCC" and the output potential VO (that is, the gate-source voltage VGSH that changes between the power-supply potential VCC level and the zero-level) is inputted to the CMOS inverter circuit IV2, and, for example, this intermediate input amplitude level is used as a logic threshold for performing an inversion output. The level shifter circuit LSH converts the level of the output signal transmitted from the CMOS inverter circuit IV2 to level of a signal that changes between the power-supply potential VCC and the ground power-supply potential GND. In addition, the level shifter circuit LSH performs inversion output while converting the level so as to output the ON/OFF detection signal HGS.

«Method of Detecting Inductor Current (Second Embodiment)»

Figure 14:
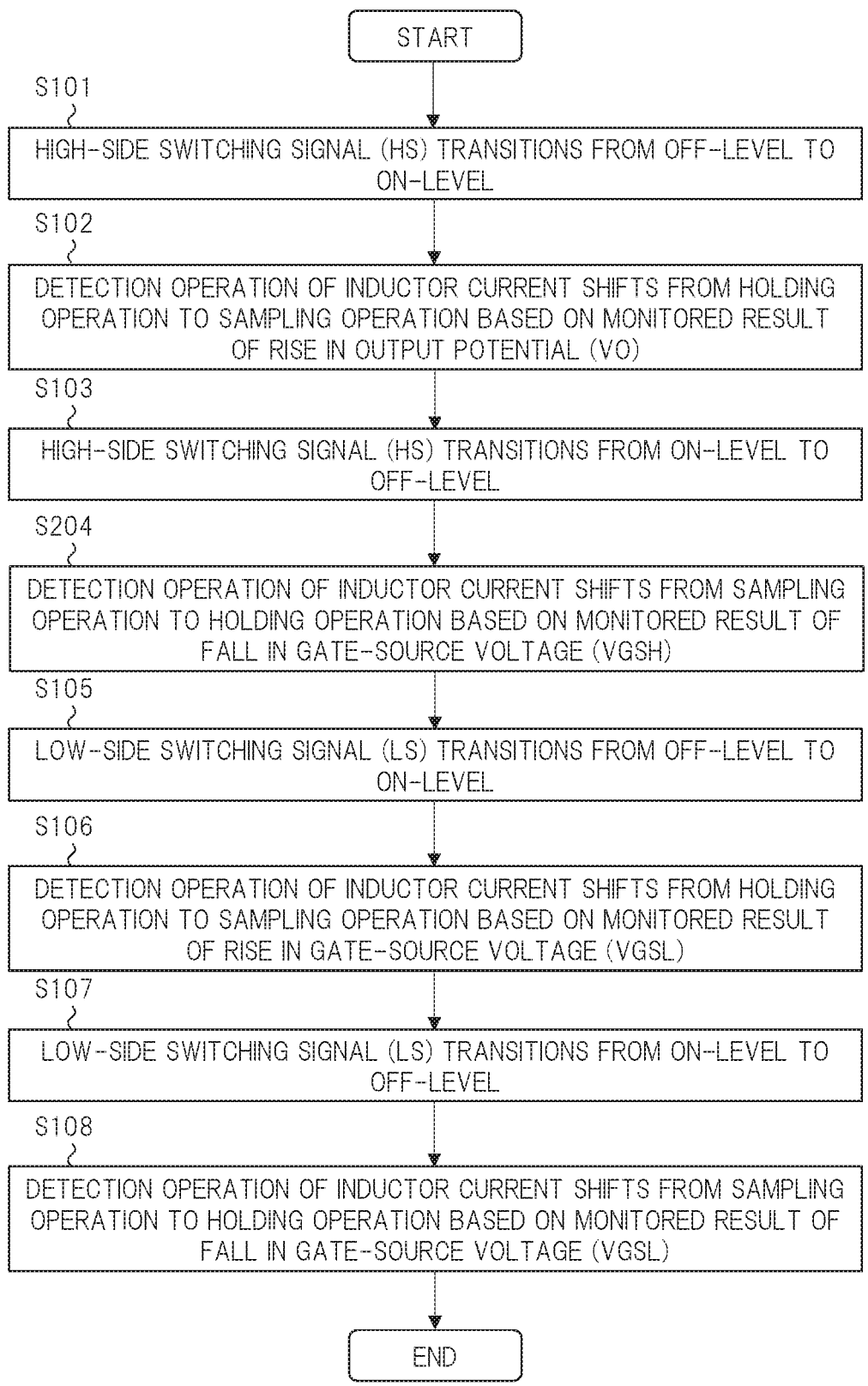
FIG. 14 is a flowchart showing an example of a method of detecting an inductor current in the load drive system according to the second embodiment of the present invention.

FIG. 14 is a flowchart showing an example of a method of detecting the inductor current in the load drive system according to the second embodiment of the present invention. The flow shown in FIG. 14 differs from the flow shown in FIG. 6 in that step S104 is replaced with step S204. In step S204, the current detection unit (that is, the current detection circuit IDT, the sample-and-hold circuit SH and the monitor circuit MNIb) allows the detection operation of the inductor current IL to shift from the sampling operation to the holding operation based on the monitored result of the fall in the gate-source voltage VGSH. Specifically, the current detection unit monitors whether, for example, the gate-source voltage VGSH has fallen to the intermediate amplitude level.

«Main Effect of Second Embodiment»

As described above, using the configuration of the second embodiment allows effects similar to those described in the first embodiment to be obtained. In addition, the inductor current can be detected with higher accuracy as compared to the configuration of the first embodiment, so that the inductor current can be controlled with higher accuracy. However, since the configuration of the second embodiment requires the output potential detection circuit VODT and the high-side ON/OFF detection circuit VGSHDT, it is more preferable to use the configuration of the first embodiment from the viewpoint of reducing the circuit area.

Third Embodiment

«Configuration of Load Drive System (Third Embodiment)»

Figure 15:
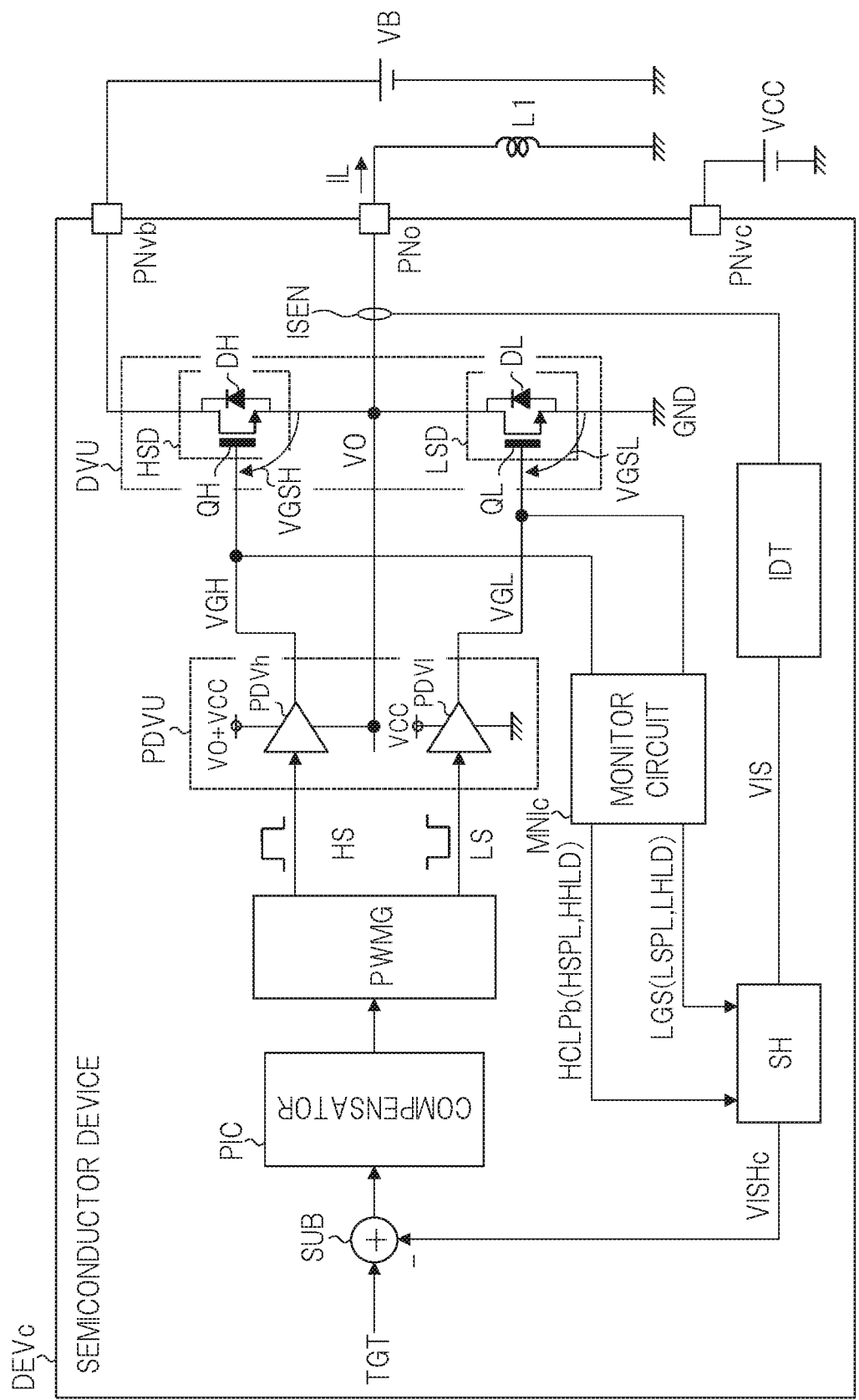
FIG. 15 is a schematic diagram showing a configuration example of a main part of a load drive system according to a third embodiment of the present invention.

FIG. 15 is a schematic diagram showing a configuration example of a main part of the load drive system according to a third embodiment of the present invention. The load drive system shown in FIG. 15 differs from the configuration example of FIG. 2 in configuration of a monitor circuit MNIc within a semiconductor device DEVc. The monitor circuit MNIc monitors the gate potential (control input potential) VGH of the high-side transistor QH instead of the output potential VO of FIG. 2 so as to generate a high-side clamp signal HCLPb substantially similar to that of FIG. 2.

The high-side sampling timing HSPL and the high-side holding timing HHLD are respectively determined by a rising edge and a falling edge of the high-side clamp signal HCLPb. On the other hand, as in the case of FIG. 2, the low-side sampling timing LSPL and the low-side holding timing LHLD are determined based on the low-side ON/OFF detection signal LGS. The sample-and-hold circuit SH performs sampling and holding operations using the corresponding timings (HSPL, HHLD, LSPL and LHLD) so as to output a detection voltage VISHc.

«Operation of Load Drive System (Third Embodiment)»

Figure 16:
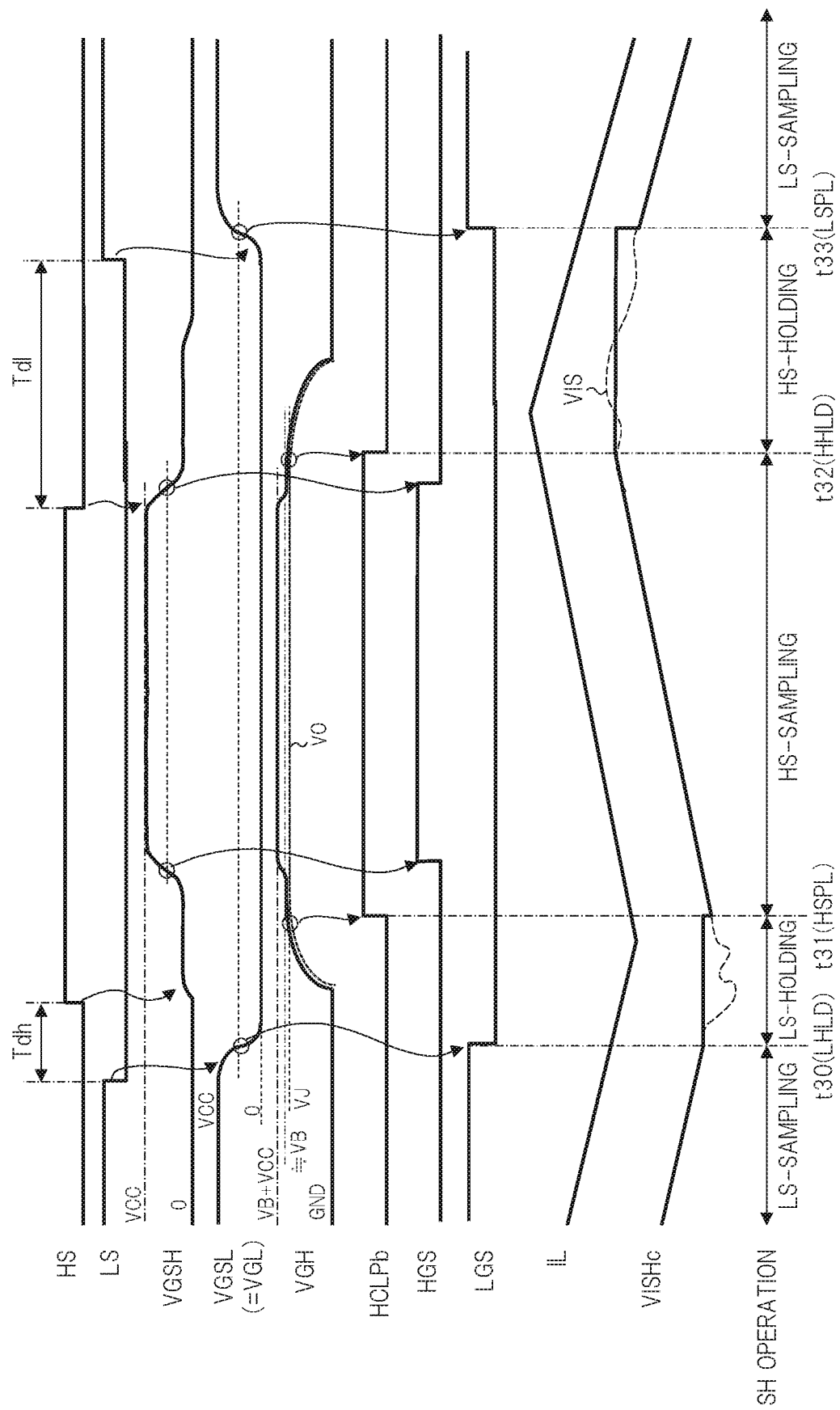
FIG. 16 is a waveform diagram showing an operation example of the load drive system of FIG. 15.

FIG. 16 is a waveform diagram showing an operation example of the load drive system of FIG. 15. Time t30 to time t33 of FIG. 16 respectively correspond to time t10 to time t13 of FIG. 3. However, at time t31, the high-side sampling timing HSPL is determined by the rising edge of the high-side clamp signal HCLPb, unlike the case at time t11. Likewise, at time t32, the high-side holding timing HHLD is determined by the falling edge of the high-side clamp signal HCLPb, unlike the case at time t12.

Here, the gate potential VGH of the high-side transistor QH becomes a value substantially equal to the output potential VO. Specifically, when the high-side switching signal HS transitions to the 'H' level, the output potential VO rises from the ground power-supply potential GND level to the battery power-supply potential VB level. Thereafter, the gate potential VGH temporarily rises from the ground power-supply potential GND level to the substantial battery power-supply potential VB level (specifically, a potential level obtained by adding the threshold voltage of the high-side transistor QH to the battery power-supply potential VB), so that the high-side transistor QH maintains the weak ON-state. Then, after the output potential VO has finished rising to the battery power-supply potential VB level, the gate potential VGH further rises from the substantial battery power-supply potential VB level to a potential level obtained by adding the power-supply potential VCC to the battery power-supply potential VB, so that the high-side transistor QH is in the strong ON-state.

In addition, when the high-side switching signal HS transitions to the 'L' level, the gate potential VGH temporarily falls to the substantial battery power-supply potential VB level, so that the high-side transistor QH is in the weak ON-state. Thereafter, when the output potential VO falls from the battery power-supply potential VB level to the vicinity of the ground power-supply potential GND level, the gate potential VGH falls from the substantial battery power-supply potential VB level to the ground power-supply potential GND level, so that the high-side transistor QH maintains the weak ON-state.

Based on such operations, when the gate potential VGH of the high-side transistor QH has risen to the determination potential VJ which is the potential level in the vicinity of the battery power-supply potential VB at time t31, the monitor circuit MNIc allows the high-side clamp signal HCLPb to rise so as to generate the high-side sampling timing HSPL. In addition, when the gate potential VGH has fallen to the determination potential VJ at time t32, the monitor circuit MNIc allows the high-side clamp signal HCLPb to fall so as to generate the high-side holding timing HHLD.

The determination potential VJ may be the same potential as, for example, the battery power-supply potential VB. In addition, the monitor circuit MNIc specifically comprises a high-side gate potential detection circuit instead of the output potential detection circuit VODT shown in FIG. 4.

The high-side gate potential detection circuit is constituted by, for example, a circuit in which the gate potential VGH is inputted instead of the output potential VO shown in FIG. 5.

«Main Effect of Third Embodiment»

As described above, using the configuration of the third embodiment allows effects similar to those described in the first embodiment to be obtained. In addition, the monitor circuit MNIc is likely to perform a more stable monitoring operation than the configuration of the first embodiment. Namely, since the output potential VO is a potential that is exposed to the outside, a certain degree of noise is likely to occur by a parasitic capacitance, a parasitic inductor or the like. On the other hand, since the gate potential VGH is an internal potential, noise is less likely to occur. As a result, erroneous detection or the like caused by noise is less likely to occur in the monitor circuit MNIc.

(Fourth Embodiment)

«Configuration of Load Drive System (Fourth Embodiment)»

Figure 17:
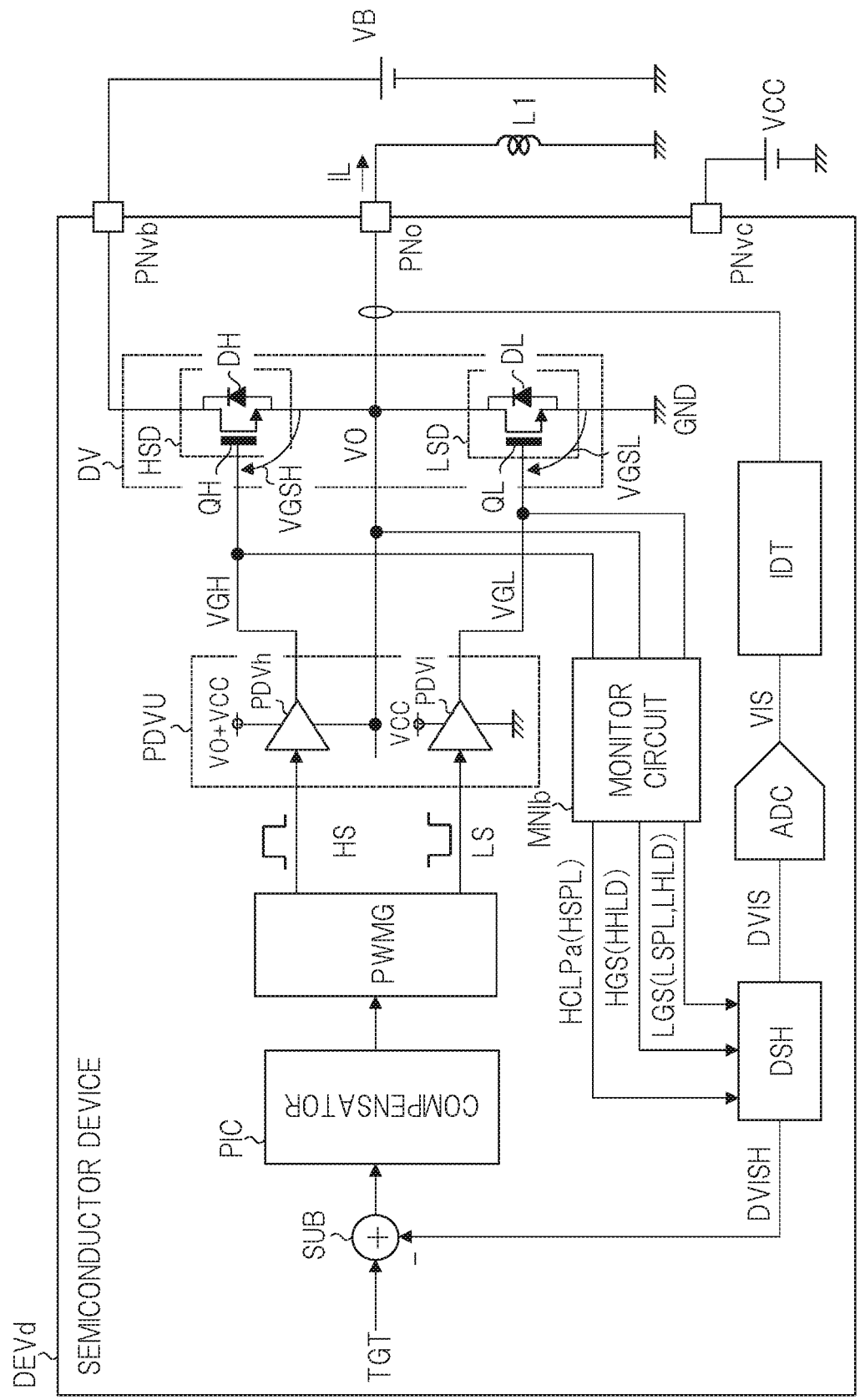
FIG. 17 is a schematic diagram showing a configuration example of a main part of a load drive system according to a fourth embodiment of the present invention.

FIG. 17 is a schematic diagram showing a configuration example of a main part of the load drive system according to a fourth embodiment of the present invention. The load drive system shown in FIG. 17 differs from the configuration example of the second embodiment shown in FIG. 10 in configuration of a semiconductor device DEVd. Unlike the configuration example of FIG. 10, the semiconductor device DEVd is provided with an analog-to-digital converter ADC, and the sample-and-hold circuit SH of FIG. 10 is replaced with a digital sample-and-hold circuit DSH constituted by a digital circuit.

The analog-to-digital converter ADC digitally converts the detection voltage VIS transmitted from the current detection circuit IDT at a sampling frequency that is faster (such as at a frequency that is several tens of times or more) than a PWM frequency of the PWM signal. The digital sample-and-hold circuit DSH operates by receiving a digital detection voltage DVIS from the analog-to-digital converter ADC as an input and outputs a digital detection voltage DVISH.

«Main Effect of Fourth Embodiment»

As described above, using the configuration of the fourth embodiment allows effects similar to those described in the second embodiment to be obtained. Further, in addition to the digital sample-and-hold circuit DSH, the error detector SUB, the compensator PIC, the PWM signal-generating circuit PWMG and the like can also be constituted by a digital circuit, making it possible to simplify the design, reduce the circuit area and power consumption, and the like. Here, the configuration example of FIG. 10 has been used. However, it should be noted that the configuration example of FIG. 2 or the configuration example of FIG. 15 may be used instead.

(Fifth Embodiment)

«Configuration of Load Drive System (Fifth Embodiment)»

Figure 18:
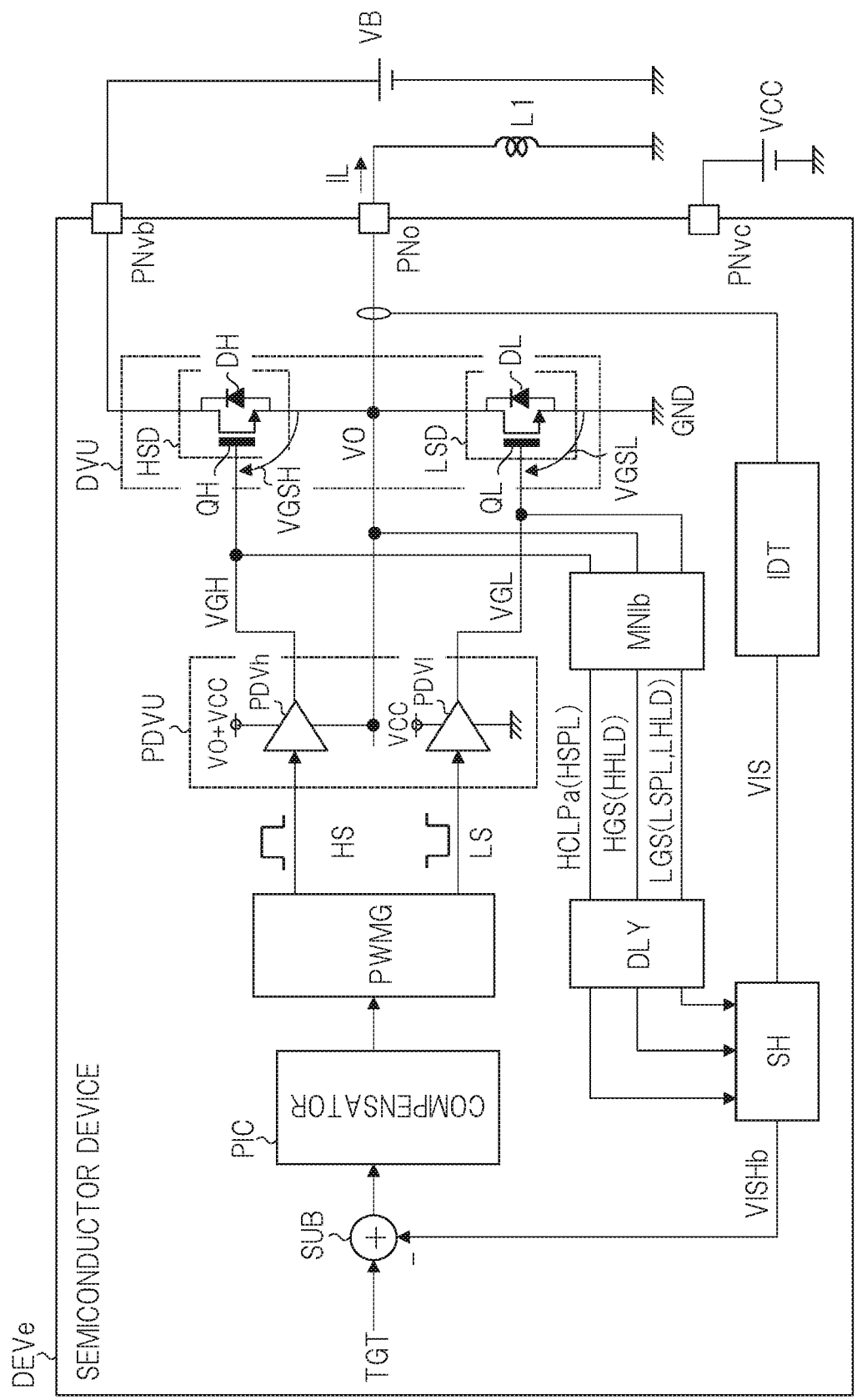
FIG. 18 is a schematic diagram showing a configuration example of a main part of a load drive system according to a fifth embodiment of the present invention.

FIG. 18 is a schematic diagram showing a configuration example of a main part of the load drive system according to a fifth embodiment of the present invention. The load drive system shown in FIG. 18 differs from the configuration example of FIG. 10 in that a delay circuit DLY is provided within the semiconductor device DEVe. The delay circuit DLY adds a delay to each of the sampling timings (HSPL and LSPL) and holding timings (HHLD and LHLD) transmitted from the monitor circuit MNIb and outputs the result to the sample-and-hold circuit SH.

For example, a certain degree of delay is likely to occur in the current detection circuit IDT. The delay circuit DLY compensates for the delay occurring in this current detection circuit IDT, so that a period in which noise is occurring in the detection voltage VIS is more precisely removed. In addition, the delay circuit DLY may add a delay to the high-side sampling timing HSPL, so that noise occurring at and after time t21 of FIG. 11 is removed as described in the second embodiment.

«Main Effect of Fifth Embodiment»

As described above, using the configuration of the fifth embodiment allows effects similar to those described in the second embodiment to be obtained. In addition, removing the noise occurring in the detection voltage VIS more precisely allows the inductor current to be detected with higher accuracy as compared to the configuration of the second embodiment, so that the inductor current can be controlled with higher accuracy. Here, the configuration example of FIG. 10 has been used. However, it should be noted that the configuration example of FIG. 2, the configuration example of FIG. 15 or the configuration example of FIG. 17 may be used instead.

In the foregoing, the invention made by the present inventor has been concretely described based on the embodiments. However, the present invention is not to be limited to the foregoing embodiments, and various modifications and alterations can be made within the scope of the present invention. For example, each of the foregoing embodiments has been described in detail for the sake of easily describing the present invention. However, the present invention is not limited to comprise all configurations described above. In addition, a portion of the configuration of one embodiment can be replaced with the configuration of another embodiment. Further, the configuration of one embodiment can be added to the configuration of another embodiment. Furthermore, other configurations may be added to, be removed from or replace a portion of the configuration of each of the embodiments.

What is claimed is:

1. A semiconductor device comprising:
    a high-side transistor coupled between a high-potential side power-supply potential and an output terminal, and allowing power to be accumulated in an inductor via the output terminal when the high-side transistor is controlled to be ON;
    a PWM signal-generating circuit generating a PWM signal that controls ON/OFF of the high-side transistor;
    a monitor circuit monitoring a high-side control input potential applied to a control input node of the high-side transistor or monitoring an output potential generated at the output terminal, and generating either one or both of a high-side sampling timing and a high-side holding timing based on a monitored result;
    a current detection circuit detecting an inductor current flowing in the inductor, and generating a first detection voltage proportional to the inductor current; and
    a sample-and-hold circuit 1) starting a sampling operation of the first detection voltage in response to the high-side sampling timing, 2) performing, while the high-side transistor is ON, the sampling operation that started in response to the high-side sampling timing, and 3) starting a holding operation of the first detection voltage in response to the high-side holding timing so as to output a second detection voltage.

2. The semiconductor device according to claim 1, wherein the monitor circuit generates the high-side sampling timing when the high-side control input potential or the output potential rises to a determination potential, and generates the high-side holding timing when the high-side control input potential or the output potential falls to the determination potential, and
    wherein the determination potential is lower than the high-potential side power-supply potential.

3. The semiconductor device according to claim 2,
    wherein the monitor circuit comprises a clamp transistor, and
    wherein the high-side control input potential or the output potential is applied to one end of the clamp transistor and a potential corresponding to the determination potential is applied to a control input node of the clamp transistor such that the clamp transistor clamps the high-side control input potential or the output potential at the determination potential serving as a lower limit value.

4. The semiconductor device according to claim 1, wherein the monitor circuit further monitors a high-side ON/OFF control voltage which is a potential difference between the high-side control input potential and the output potential, generates the high-side sampling timing based on the monitored result of the high-side control input potential or the output potential, and generates the high-side holding timing based on the monitored result of the high-side ON/OFF control voltage.

5. The semiconductor device according to claim 1, further comprising
    an analog-to-digital converter digitally converting the first detection voltage transmitted from the current detection circuit at a sampling frequency that is faster than a PWM frequency of the PWM signal,
    wherein the sample-and-hold circuit is constituted by a digital circuit that receives a digital signal from the analog-to-digital converter as an input.

6. The semiconductor device according to claim 1, further comprising
    a delay circuit adding a delay to each of the high-side sampling timing and high-side holding timing transmitted from the monitor circuit, and outputting the result to the sample-and-hold circuit.

7. The semiconductor device according to claim 1, further comprising
    a low-side transistor coupled between the output terminal and a low-potential side power-supply potential, having ON/OFF controlled complementarily with the high-side transistor, and allowing the inductor current to reflow when the low-side transistor is controlled to be ON,
    wherein the monitor circuit further monitors a low-side ON/OFF control voltage which is a potential difference between the low-potential side power-supply potential and a low-side control input potential applied to a control input node of the low-side transistor, and generates a low-side sampling timing and a low-side holding timing based on the monitored result, and
    the sample-and-hold circuit further 1) starts a sampling operation of the first detection voltage in response to the low-side sampling timing, 2) performs, while the low-side transistor is turned ON, the sampling operation that started in response to the low-side sampling timing, 3) starts a holding operation of the first detection voltage in response to the low-side holding timing, and 4) performs, while the low-side transistor is turned OFF, the holding operation that started in response to the low-side holding timing.

8. The semiconductor device according to claim 1, further comprising
    a compensator determining a PWM duty ratio such that an error between the second detection voltage transmitted from the sample-and-hold circuit and a predetermined target voltage is brought close to zero, and transmitting the PWM duty ratio to the PWM signal-generating circuit.

9. A load drive system comprising:
    an inductor coupled to an output terminal and serving as a load;
    a high-side transistor coupled between a high-potential side power-supply potential and the output terminal, and allowing power to be accumulated in the inductor via the output terminal when the high-side transistor is controlled to be ON;
    a PWM signal-generating circuit generating a PWM signal that controls ON/OFF of the high-side transistor;
    a monitor circuit monitoring a high-side control input potential applied to a control input node of the high-side transistor or monitoring an output potential generated at the output terminal, and generating either one or both of a high-side sampling timing and a high-side holding timing based on a monitored result;
    a current detection circuit detecting an inductor current flowing in the inductor, and generating a first detection voltage proportional to the inductor current; and
    a sample-and-hold circuit 1) starting a sampling operation of the first detection voltage in response to the high-side sampling timing, 2) performing, while the high-side transistor is turned ON, the sampling operation that started in response to the high-side sampling timing, and 3) starting a holding operation of the first detection voltage in response to the high-side holding timing so as to output a second detection voltage.

10. The load drive system according to claim 9, wherein the monitor circuit generates the high-side sampling timing when the high-side control input potential or the output potential rises to a determination potential, and generates the high-side holding timing when the high-side control input potential or the output potential falls to the determination potential, wherein the determination potential is lower than the high-potential side power-supply potential.

11. The load drive system according to claim 9, wherein the monitor circuit further monitors a high-side ON/OFF control voltage which is a potential difference between the high-side control input potential and the output potential, generates the high-side sampling timing based on the monitored result of the high-side control input potential or the output potential, and generates the high-side holding timing based on the monitored result of the high-side ON/OFF control voltage.

12. The load drive system according to claim 9, further comprising
    an analog-to-digital converter digitally converting the first detection voltage transmitted from the current detection circuit at a sampling frequency that is faster than a PWM frequency of the PWM signal,
    wherein the sample-and-hold circuit is constituted by a digital circuit that receives a digital signal from the analog-to-digital converter as an input.

13. The load drive system according to claim 9, further comprising
    a low-side transistor coupled between the output terminal and a low-potential side power-supply potential, having ON/OFF controlled complementarily with the high-side transistor, and allowing the inductor current to reflow when the low-side transistor is controlled to be ON,
    wherein the monitor circuit further monitors a low-side ON/OFF control voltage which is a potential difference between the low-potential side power-supply potential and a low-side control input potential applied to a control input node of the low-side transistor, and generates a low-side sampling timing and a low-side holding timing based on the monitored result, and
    wherein the sample-and-hold circuit further 1) starts a sampling operation of the first detection voltage in response to the low-side sampling timing, 2) performs, while the low-side transistor is turned ON, the sampling operation that started in response to the low-side sampling timing, 3) starts a holding operation of the first detection voltage in response to the low-side holding timing, and 4) performs, while the low-side transistor is turned OFF, the holding operation that started in response to the low-side holding timing.

14. The load drive system according to claim 9, further comprising
    a compensator determining a PWM duty ratio such that an error between the second detection voltage transmitted from the sample-and-hold circuit and a predetermined target voltage is brought close to zero, and transmitting the PWM duty ratio to the PWM signal-generating circuit.

15. The load drive system according to claim 14, wherein the inductor is provided in a solenoid valve.

16. The load drive system according to claim 9, wherein the high-side transistor, the PWM signal-generating circuit, the monitor circuit, the current detection circuit, and the sample-and-hold circuit are mounted on a single semiconductor chip.

17. A method of detecting an inductor current by using a load drive system that includes:
    an inductor coupled to an output terminal and serving as a load;
    a high-side transistor coupled between a high-potential side power-supply potential and the output terminal, having ON/OFF controlled by a PWM signal, and allowing power to be accumulated in the inductor via the output terminal when the high-side transistor is controlled to be ON; and
    a current detection unit detecting the inductor current flowing in the inductor by sampling and holding operations,
    wherein the current detection unit performs:
        a first step of monitoring a high-side control input potential applied to a control input node of the high-side transistor or monitoring an output potential generated at the output terminal,
        a second step of generating either one or both of a high-side sampling timing and a high-side holding timing based on a monitored result obtained in the first step, and
        a third step of 1) starting the sampling operation in response to the high-side sampling timing, 2) performing, while the high-side transistor is turned ON, the sampling operation that started in response to the high-side sampling timing, and 3) starting the holding operation in response to the high-side holding timing.

18. The method of detecting an inductor current according to claim 17, wherein, in the second step, the current detection unit generates the high-side sampling timing when the high-side control input potential or the output potential rises to a determination potential, and generates the high-side holding timing when the high-side control input potential or the output potential falls to the determination potential, and wherein the determination potential is lower than the high-potential side power-supply potential.

19. The method of detecting an inductor current according to claim 17, wherein, in the first step, the current detection unit further monitors a high-side ON/OFF control voltage which is a potential difference between the high-side control input potential and the output potential, and wherein, in the second step, the current detection unit generates the high-side sampling timing based on the monitored result of the high-side control input potential or the output potential, and generates the high-side holding timing based on the monitored result of the high-side ON/OFF control voltage.

20. The method of detecting an inductor current according to claim 17, wherein the load drive system further comprises a low-side transistor coupled between the output terminal and a low-potential side power-supply potential, the low-side transistor having ON/OFF controlled complementarily with the high-side transistor and allowing the inductor current to reflow when the low-side transistor is controlled to be ON, wherein, in the first step, the current detection unit further monitors a low-side ON/OFF control voltage which is a potential difference between the low-potential side power-supply potential and a low-side control input potential applied to a control input node of the low-side transistor, wherein, in the second step, the current detection unit further generates a low-side sampling timing and a low-side holding timing based on a monitored result of the low-side ON/OFF control voltage, and wherein, in the third step, the current detection unit further 1) starts the sampling operation in response to the low-side sampling timing, 2) performs, while the low-side transistor is turned ON, the sampling operation that started in response to the low-side sampling timing, 3) starts the holding operation in response to the low-side holding timing, and 4) performs, while the low-side transistor is turned OFF, the holding operation that started in response to the low-side holding timing.

* * * * *